US006447636B1

United States Patent
Qian et al.

(10) Patent No.: US 6,447,636 B1
(45) Date of Patent: Sep. 10, 2002

(54) PLASMA REACTOR WITH DYNAMIC RF INDUCTIVE AND CAPACITIVE COUPLING CONTROL

(75) Inventors: Xue-Yu Qian; Zhi-Wen Sun, both of San Jose; Maocheng Li, Fremont; John Holland; Arthur H. Sato, both of San Jose; Valentin N. Todorov, Fremont; Patrick L. Leahey; Robert E. Ryan, both of San Jose, all of CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 09/505,578

(22) Filed: Feb. 16, 2000

(51) Int. Cl.[7] .......................... H05H 1/00; C23C 16/00; H01J 1/00
(52) U.S. Cl. .............................. 156/345.48; 118/723 I; 315/111.51
(58) Field of Search .................. 156/345.48, 345.47; 118/723 I, 723 E, 723 AN; 315/111.21, 111.51, 111.31

(56) References Cited

U.S. PATENT DOCUMENTS

| 5,449,432 A | * | 9/1995 | Hanawa ................ 156/643.1 |
| 5,540,824 A | * | 7/1996 | Yin et al. ............. 204/298.34 |
| 5,607,542 A | | 3/1997 | Wu et al. .................. 156/643 |
| 5,614,055 A | * | 3/1997 | Fairbairn et al. .......... 156/345 |
| 5,685,941 A | | 11/1997 | Forster et al. ............. 156/345 |
| 5,710,486 A | | 1/1998 | Ye et al. ................ 315/111.21 |
| 5,865,896 A | | 2/1999 | Nowak et al. .............. 118/723 |
| 5,888,414 A | | 3/1999 | Collins et al. ................ 216/68 |
| 5,919,382 A | | 7/1999 | Qian et al. ............. 219/121.52 |
| 6,054,013 A | * | 4/2000 | Collins et al. ............. 156/345 |
| 6,310,577 B1 | * | 10/2001 | Ra ............................. 343/701 |

OTHER PUBLICATIONS

U.S. patent application Ser. No. 09/124,323, Han et al., filed Jul. 29, 1998.

* cited by examiner

Primary Examiner—Gregory Mills
Assistant Examiner—P. Hassanzadeh
(74) Attorney, Agent, or Firm—Townsend Townsend & Crew; Joseph Bach

(57) ABSTRACT

The invention provides a system and a method for dynamic RF inductive and capacitive coupling control to improve plasma substrate processing, as well as for achieving contamination and defect reduction. A plasma reactor includes a substrate support disposed in a chamber. An RF coil is disposed adjacent the chamber for inductively coupling RF energy into the chamber. An electrode is disposed adjacent the chamber and has a voltage for capacitively coupling energy into the chamber. The electrode is spaced from the substrate support and the RF coil. An electrode adjusting member is coupled with the electrode for dynamically adjusting the voltage in the electrode to vary the capacitive coupling for improved plasma ignition and plasma stability. A Faraday shield may be placed between the RF coil and the plasma process region in the chamber to suppress capacitive coupling of the RF coil. Sensors may be provided to monitor the amounts of inductive coupling and capacitive coupling to provide feedback to a controller which is used to adjust the inductive coupling and capacitive coupling in real time to stabilize the plasma and achieve improved processing.

43 Claims, 14 Drawing Sheets

▲ CONVENTIONAL SYSTEM, 4mTorr
■ CONVENTIONAL SYSTEM, 6mTorr
♦ CONVENTIONAL SYSTEM, 8mTorr
✹ PRESENT SYSTEM, 4mTorr

PLASMA REACTOR WITH DYNAMIC RF INDUCTIVE AND CAPACITIVE COUPLING CONTROL

BACKGROUND OF THE INVENTION

The present invention relates to the fabrication of integrated circuits. More particularly, the present invention is directed toward a plasma reactor which provides dynamic inductive and capacitive coupling control for improved performance.

Inductively coupled plasma reactors are known for high density plasma (HDP) processing that includes etching, chemical vapor deposition, and so forth. Examples of such reactors are found in commonly assigned U.S. Pat. Nos. 5,919,382, 5,888,414, 5,614,055, and 5,540,800. Inductively coupled reactors often employ a coiled antenna wound around or near a portion of the reactor chamber and connected to an RF (radio frequency) power source to couple RF energy inductively into the reactor. These reactors typically provide independent control of high density ion generation and ion energy. For example, in some HDP reactors, ion density is primarily controlled by adjusting the RF current in the antenna, while ion energy is primarily controlled by a separate RF power, usually called RF bias, connected to the wafer pedestal.

The voltage in the antenna also produces capacitive coupling to the plasma, which can cause plasma potential oscillation, thereby widening the ion energy distribution. The capacitive coupling may further cause excessive ion bombardment on the chamber wall adjacent the antenna, resulting in an increase in chamber wear and the amount of contaminant particles. Faraday shields have been placed between the antenna and the plasma to suppress capacitive coupling of the RF antenna, as disclosed, for example, in U.S. Pat. Nos. 5,888,414, 5,614,055, and 5,540,800.

The removal of the capacitive coupling of the RF antenna in HDP reactors may make it more difficult to ignite a plasma and maintain a stable plasma in some cases. For instance, the bias RF energy applied to the wafer pedestal often does not provide adequate energy to ignite the plasma if the RF antenna's capacitive coupling is removed by a Faraday shield.

Numerous plasma reactor designs that include both electrodes and coils have been proposed. For example, one system includes an auxiliary electrode for providing capacitive coupling of RF energy to ensure reliable plasma ignition. Another system employs a pair of parallel capacitive electrodes facing each other in the chamber and an inductive coil wound around a portion of the chamber. Another system includes a coil antenna and a generally planar ceiling electrode which is substantially the same in diameter as the wafer held in the wafer pedestal in the chamber.

There is still a need for a method and an apparatus for controlling the inductive coupling and capacitive coupling in a plasma reactor to achieve improved plasma stability and ignition reliability while reducing erosion and contamination.

SUMMARY OF THE INVENTION

The present invention provides a system and a method for dynamic control of the capacitive coupling and inductive coupling of energy into a plasma processing chamber to improve plasma substrate processing, as well as for achieving contamination and defect reduction.

The invention provides an inductive coil for electromagnetically coupling RF energy into the process chamber. The capacitive coupling of the inductive coil into the chamber is desirably suppressed using a Faraday shield or by increasing the spacing between the inductive coil and the chamber wall. An electrode is provided to capacitively couple energy into the chamber. By suppressing the capacitive coupling of the inductive coil and controlling the energy supplied to the electrode, the capacitive coupling into the chamber can be precisely controlled. In a specific embodiment, the same power source is used to supply energy to the inductive coil and the electrode. A coupler is used to apportion the energy supplied to the inductive coil and the electrode.

In specific embodiments, the relative amounts of capacitive and inductive energy provided to the plasma can be dynamically adjusted at ignition and/or during processing, desirably in real time using a computer control system. The conditions such as temperature and pressure may be changed or the process gas mixture may be altered during processing, for instance, for etching or depositing a single layer or different layers on a substrate. Similarly, different amounts of capacitive coupling and inductive coupling may be desirable for maintaining a stable plasma. Parameters that would produce a stable plasma may be predetermined for specific processing conditions, and subsequently used as input to a computer program to control the plasma to enhance plasma stability and process optimization.

Sensors may be provided to monitor the power supplied to the electrode and the inductive coil to provide feedback to a controller which is used to control the RF power levels to adjust the inductive coupling and capacitive coupling in real time. Dynamic inductive and capacitive coupling control produces improved process conditions for achieving reliable plasma ignition, maintaining plasma stability, and enhancing other process characteristics.

Furthermore, to minimize erosion and contamination, the chamber wall adjacent the inductive coil is made of a material that is highly erosion-resistant. On the other hand, the chamber wall adjacent the electrode is made of a material that produces essentially no particles and contaminant compounds from erosion.

BRIEF DESCRIPTION OF THE DRAWINGS

FIG. 4AA is a perspective view of the plasma reactor of FIG. 4A;

FIG. 4BB is a perspective view of the plasma reactor of FIG. 4B;

DESCRIPTION OF THE SPECIFIC EMBODIMENTS

I. Exemplary System

Figure 1:
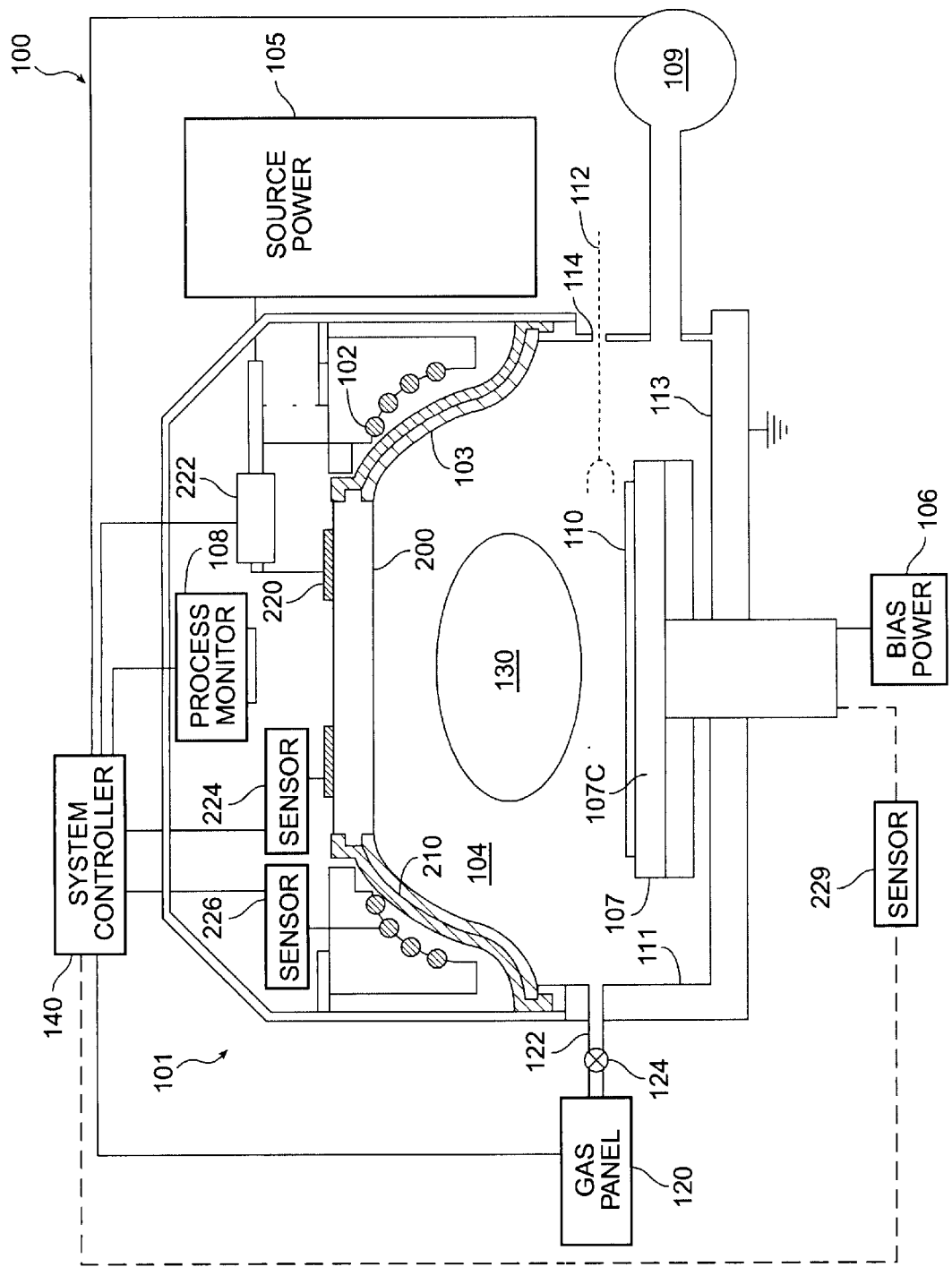
FIG. 1 is a partial cross-sectional schematic view of a semiconductor processing system in accordance with an embodiment of the present invention.

FIG. 1 depicts a schematic diagram of a semiconductor wafer processing system 100. The depicted system is illustratively an inductively coupled plasma etch system. The system 100 includes a process chamber 101, a source power supply 105, a bias power supply 106, and a system controller 140. The process chamber 101 has a process volume 104 defined by a dome or top 103, a cylindrical sidewall 111, and a bottom 113.

The source power supply 105 couples an RF signal (e.g., 12.56 MHz) to an antenna 102. The antenna 102 has a plurality of turns located proximate the top 103 and produces RF electromagnetic fields that excite a process gas (or gases) located in the process volume 104 to form and/or sustain a plasma 130. The density of ions in the plasma 130 is primarily controlled by the signal applied to antenna 102.

Figure 1A:
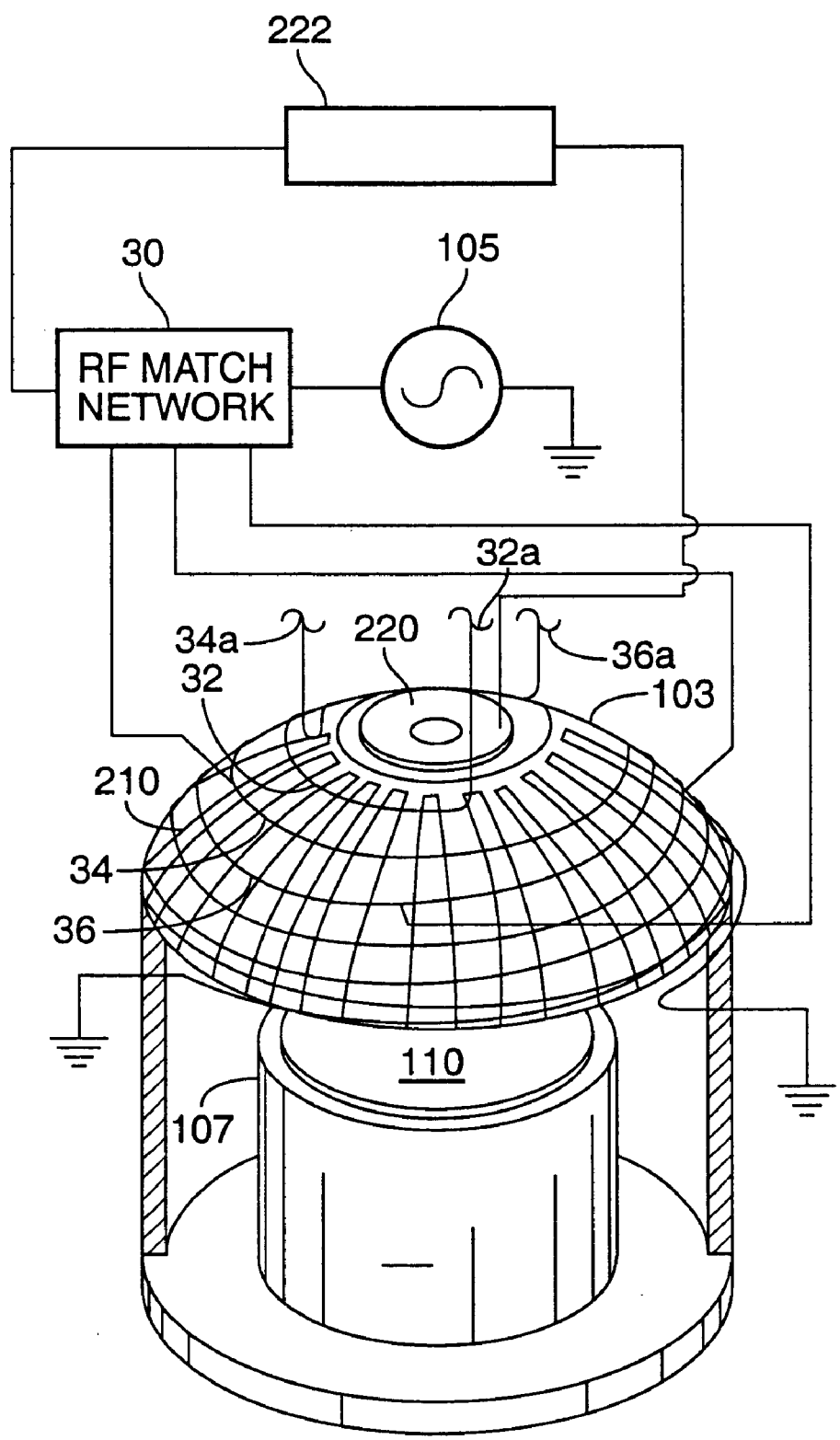
FIG. 1A is a perspective view of a plasma reactor in the processing system of FIG. 1 illustrating one embodiment of the invention.

In one embodiment, the antenna 102 is a low voltage source coil as described in U.S. Pat. No. 5,919,382 to Qian et al. An example of the low voltage source coil antenna 102 is illustrated in FIG. 1A. The antenna 102 is a multiple concentric spiral coil having windings 32, 34, 36 which conform to the shape of the dome 103. The coil 102 has a central opening over the center of the dome 103 to alleviate a concentration of plasma ion density at the center. An electrode 220 is placed at the center of the dome 103 and a Faraday shield 210 is placed between the windings 32, 34, 36 and the dome 103, as discussed in more detail below. An RF match network 30 is desirably provided to match the output impedance of the RF generator with the RF coil windings 32, 34, 36.

Figure 1B:
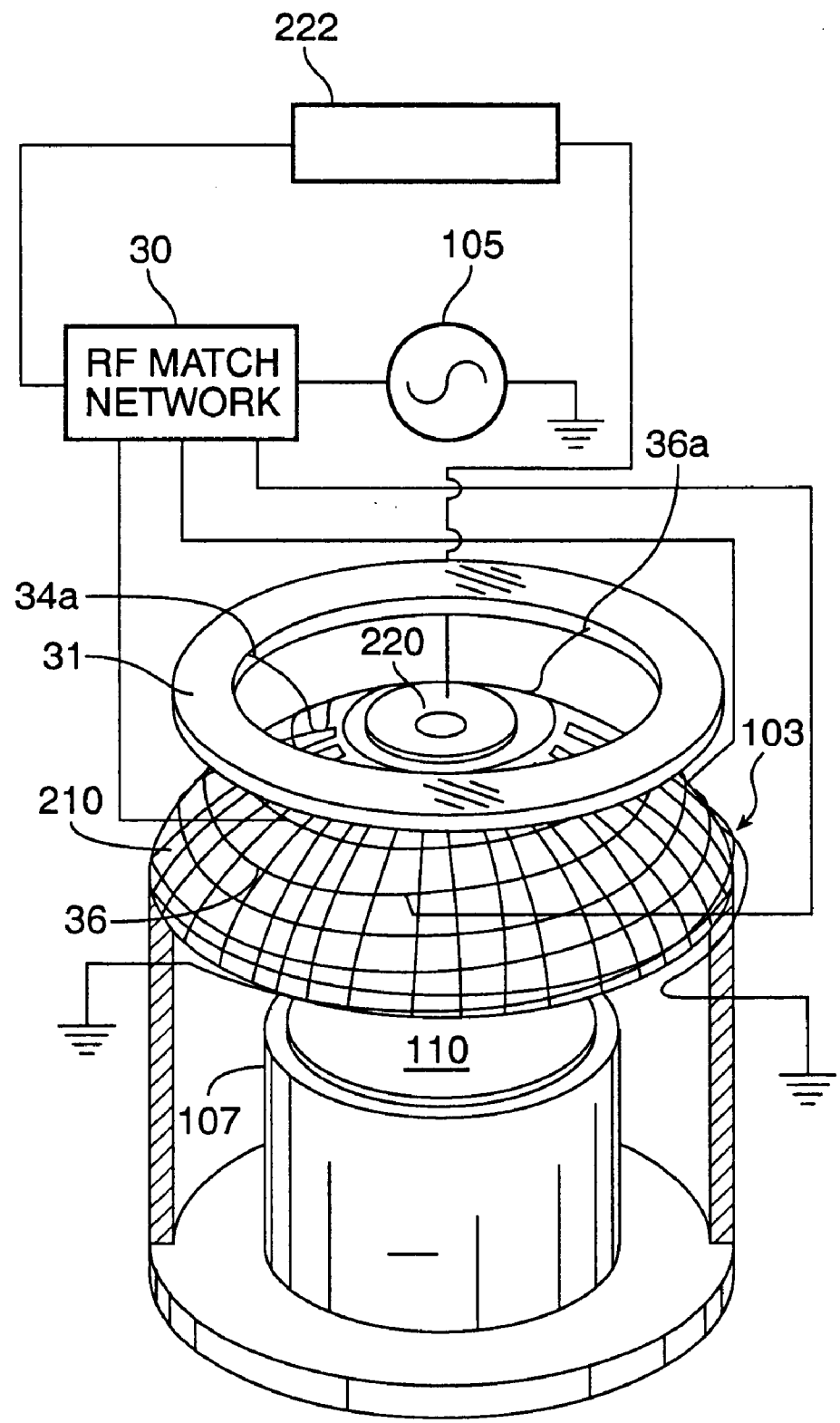
FIG. 1B is a perspective view of a plasma reactor in the processing system of FIG. 1 illustrating another embodiment of the invention.

As shown in FIG. 1A, the inner conductor ends 32a, 34a, 36a of the multiple spiral coil windings 32, 34, 36 are disposed away from the ceiling of the dome 103 to avoid having any of the conductors (32, 34, 36) of the coil antenna near the center of the dome 103. In one implementation as shown in FIG. 1B, the inner conductor ends 32a, 34a, 36a are connected radially outwardly and slightly upwardly away from the ceiling to a large diameter annular or ring-shaped common conductor 31.

As illustrated in FIG. 1, a robot arm 112, shown in phantom, transfers the wafers in and out of process chamber 101 through a slit valve 114. During substrate processing, a semiconductor wafer 110, which may contain partially formed integrated circuit structures, is supported upon a pedestal 107 which includes an electrostatic chuck 107C. The wafer 110 is exposed to the plasma 130 to facilitate processing. The pedestal 107 and thus the wafer 110 are biased by an RF signal (e.g., 13.56 MHz) supplied to the pedestal 107 by the bias power supply 106. The biased pedestal 107 is typically a cathode.

The temperature within the chamber 101 of FIG. 1 is partly controlled by circulating a fluid (e.g., water-based ethylene glycol) through separate heat exchange passages (not shown) within the sidewall 111 and dome 103 of the chamber. The temperature of the substrate 110 being processed is controlled by a combination of a gas applied to the backside of the substrate 110 through passages (not shown) within pedestal 107 and a fluid circulated through a heat exchange passage (not shown) within the pedestal 107.

The exterior of the chamber 101 is typically at ambient atmospheric pressure and the interior of the chamber 101 is held at a reduced pressure during processing. As shown in FIG. 1, a vacuum pumping system 109 regulates the pressure within chamber 101. A gas panel 120 delivers process gases to the chamber 101 via a gas line 122 and a valve 124. In a plasma process, such as a plasma etch process, the plasma 130 is formed in the chamber 101 by applying RF power from the RF power source 105 to the process gas.

A. Suppressing Capacitive Coupling of Inductive Member

Figure 2:
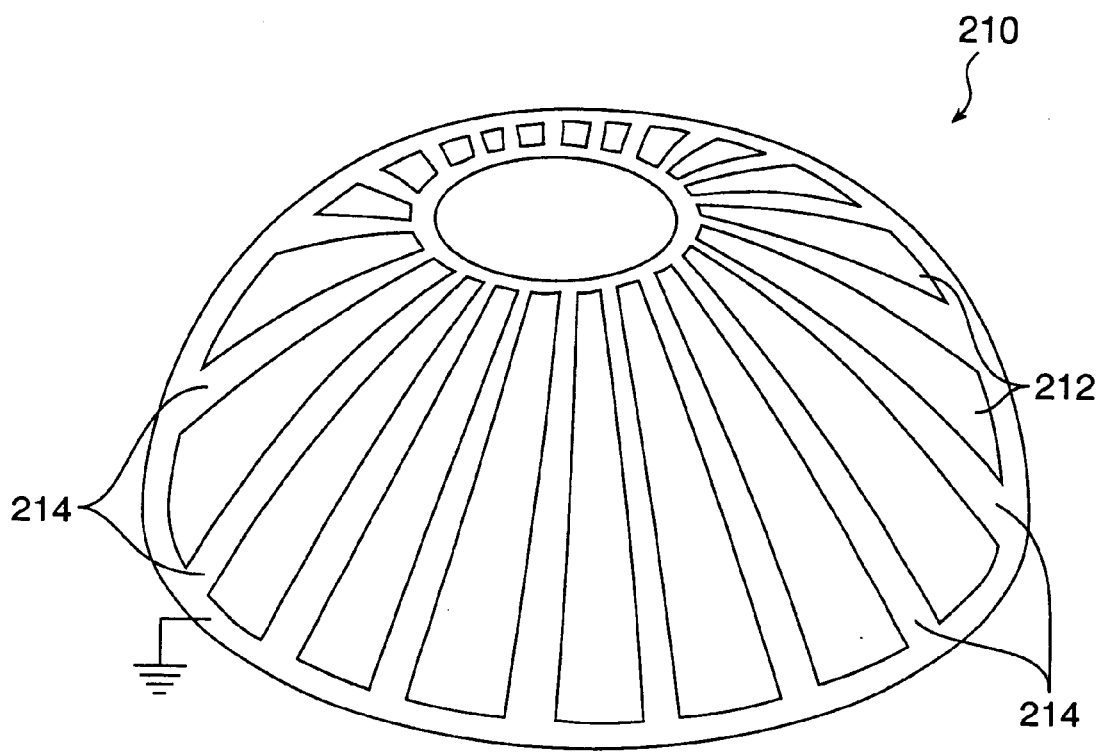
FIG. 2 is a perspective view of a Faraday shield in the processing system of FIG. 1 according to an embodiment of the invention.

The capacitive energy of the inductive antenna 102 may desirably be suppressed or reduced. In one embodiment, a Faraday shield 210 is placed between the antenna 102 and the chamber wall to suppress capacitive coupling of the antenna 102 into the process volume 104 for forming the plasma 130, as seen in FIG. 1. FIG. 2 illustrates an embodiment of the Faraday shield 210. The Faraday shield 210 maybe grounded as shown in FIG. 2, or left floating.

As seen in FIG. 2, the Faraday shield 210 includes an insulative shell 212 overlaid or embedded with a plurality of spaced conductive strips 214 oriented generally in a direction transverse to the antenna coil 102. The conductive strips 214 may be grounded or floating to suppress capacitive coupling of the antenna 104. There is at least one insulative space 212 on the shield 210, and preferably a plurality of insulative spaces 212 between a plurality of conductive strips 214. The insulative spaces between the conductive strips 214 block eddy currents that would otherwise tend to flow circumferentially or laterally around the dome. The use of a plurality of strips 214 is desirable to minimize eddy current losses. The Faraday shield 210 reduces ion bombardment on the chamber wall adjacent the antenna 102, resulting in a decrease in wear and contamination.

The Faraday shield 210 is advantageously a full shield continuously covering the area between the antenna 102 and the process volume 104 to preclude line of sight paths for electric field lines through the shield 210. The conductive strips 214 may include a variety of conductive materials, and is typically made of copper. The insulative shell 212 includes an electrically insulative material such as polyimide or the like. The insulative shell 212 preferably is sufficiently strong and tolerant of high temperature typically in the vicinity of about 200° C. The conductive strips 214 are at least one skin depth in thickness at the frequency of operating the antenna 102. For instance, the thickness typically may range from about 1 to 10 mil at a frequency of about 13 MHz. In a specific embodiment, the Faraday shield 210 is formed by overlaying a Kapton™ tape with copper and etching strips of the copper to form the insulative spaces 212. An insulative layer (not shown) may be placed between the Faraday shield 210 and the antenna 102.

In another embodiment, the Faraday shield 210 is not used and the antenna 102 is sufficiently spaced from the chamber 101 to suppress the capacitive energy coupled from the antenna 102 into the chamber 101. Adjusting the spacing between the antenna 102 and the wall of the chamber 101 varies the capacitive impedance between the antenna 102 and the plasma 130. Increasing the size of the spacing raises the capacitive impedance between the antenna 102 and the plasma 130, thereby reducing the capacitive coupling of the antenna 102. When the antenna 102 is sufficiently spaced from the chamber 101, the capacitive coupling of the antenna 102 is substantially reduced. This permits better control of the capacitive coupling of energy by independently coupling capacitive energy into the chamber 101, as discussed in more detail below.

The bias RF energy supplied to the pedestal 107 provides control of the energy of the ions by capacitive coupling, but this amount of capacitively coupled power may not be adequate to ignite the plasma or to stabilize the plasma. To improve control of the capacitive coupling, the chamber 101 includes an electrode 220 which is spaced from the pedestal 107. In FIG. 1, the electrode 220 is an annular plate. The electrode 220 is placed centrally on the dome 103 above the pedestal 107 and in a center region surrounded by the coil antenna 102. In particular, the electrode 220 is placed over the quartz dome insert 200.

Figure 3:
FIG. 3 show alternate embodiments of an electrode in the processing system of FIG. 1.

It is appreciated that the electrode 220 may have other shapes. For example, the electrode 220 may be a solid plate. FIG. 3 shows examples of an annular plate 220 and a solid plate 220A. The electrode 220 is desirably disposed on the outside of the chamber 101, although it may be placed inside in an alternate embodiment.

The surface area of the electrode 220 facing the chamber volume 104 may be about the same in size as the surface area of the wafer 110, but may also be larger or smaller in size than the surface area of the wafer 110. Generally, a larger area for the electrode 220 will produce more uniform energy coupling, especially if the energy being coupled through the electrode 220 is high.

B. Chamber Materials and Configurations

In the chamber 101 of FIG. 1, the dome 103 is typically made of a dielectric material such as quartz or ceramic. Although the dome 103 may be made entirety of quartz or ceramic, desirably most of he dome is made of ceramic with a transparent central dome insert 200, typically made of quartz. The sidewall 111 and bottom 113 are typically made of a metal such as aluminum or stainless steel. The dome material is preferably resistant to erosion under plasma processing conditions.

In specific embodiments, the dome or top 103 is mainly a ceramic component that is typically electrically insulating and the crystallinity of which varies among amorphous, glassy, microcrystalline, and singly crystalline, dependent on material and its processing. The ceramic compound is preferably an essentially non-porous material. It is a good electrical insulator, and because it can be made in a relatively pure form (approximately 99% by weight or better) it has a low degree of chemical reactivity in the plasma environment. The ceramic compound may be any suitable ceramic compound, preferably one that may combine with the oxide of Group IIIB metal to form a highly erosion-resistive ceramic structure. The ceramic compound is preferably selected from silicon carbide (SiC), silicon nitride ($Si_3N_4$), boron carbide ($B_4C$), boron nitride (BN), aluminum nitride (AlN), aluminum oxide ($Al_2O_3$) and mixtures thereof. More preferably, the ceramic compound comprises aluminum oxide ($Al_2O_3$), especially since aluminum oxide is relatively inexpensive and readily available.

The aluminum oxide should be sufficiently pure that it does not "out-gas" or include contaminants that could be sputtered onto the substrate during process operation, and it should be chemically stable when exposed to the particular etching processes contemplated. While aluminum oxide is a preferred ceramic compound for a preferred embodiment of the present invention, it is to be understood that the spirit and scope of the present invention includes other insulative materials which can provide similar effects, for example, the oxides and fluorides of aluminum, magnesium, and tantalum. Some of these are crystalline or polycrystalline insulating materials. Some may be made as glassy ceramics. Thus, the aluminum oxide or other metal oxide ceramics can be a single crystal oxide, polycrystalline oxide, or amorphous oxide. These materials are all electrically insulating and generally robust in a plasma etching environment and should not create undesired particulates in the presence of high density plasma. Other materials can alternatively be used.

The Group IIIB metal can be one of scandium (Sc), yttrium (Y), the cerium subgroup, the yttrium subgroup, and mixtures thereof. The cerium subgroup includes lanthanum (La), cerium (Ce), praseodymium (Pr), neodymium (Nd), promethium (Pm), and samarium (Sm). The yttrium subgroup includes europium (Eu), gadolinium (Gd), terbium (Tb), dysprosium (Dy), holmium (Ho), erbium (Er), thulium (Tm), ytterbium (Yb) and lutetium (Lu). In a preferred embodiment of the present invention, the Group IIIB metal is yttrium (Y); thus, the preferred oxide of a Group IIIB metal is $Y_2O_3$.

The use of quartz for the dome insert 200 in the portion of the chamber wall adjacent the electrode 220 is advantageous. The portion of the chamber wall adjacent the electrode 220 is subject to high energy ion bombardment from capacitive coupling. If a ceramic material is used in that portion of the chamber wall, for instance, the ion bombardment may produce a substantial amount of particle contaminants. For example, aluminum oxide ($Al_2O_3$) subject to ion bombardment during etching of wafer substrates will cause the formation of large particles and contaminant compounds (e.g., aluminum fluoride or the like) which can damage patterned wafer substrates. Quartz, on the other hand, will not produce such large particles and contaminant compounds even though it is susceptible to erosion during plasma processing. Instead, by-products generated from erosion of quartz such as silicon fluoride are gas-phase products that are pumped out of the chamber. For the dome 103, the Faraday shield 210 advantageously suppresses capacitive coupling of the antenna 102 and the associated ion bombardment of the ceramic dome material.

In any event, the material for the dome insert 200 adjacent the electrode 220 should be one which produces less, preferably substantially less, contaminants than the remaining material for the dome 103. That is, the dome insert material for insert 200 has a lower contamination yield than the remaining dome material. Contamination yield as used herein refers to the amount of particles and contaminants produced during plasma processing. The dome insert material most preferably produces substantially no contaminants.

Materials other than quartz with low contaminant production can include a core material coated with an erosion-resistant material. A specific example is include a diamond coating applied on a core material such as silicon nitride. The diamond coating protects the core and prevents contaminant production.

Figure 4A:
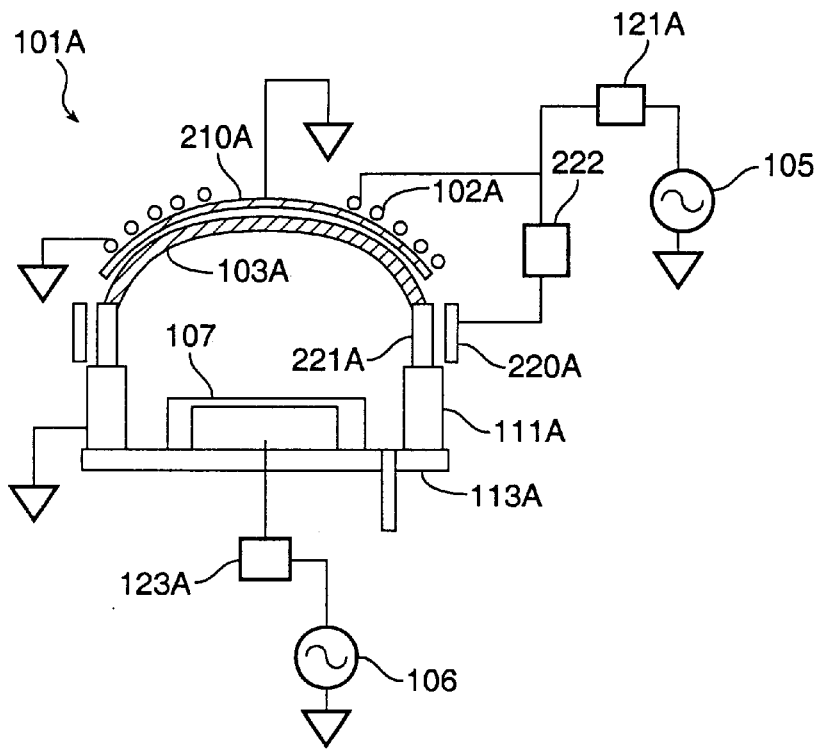
FIG. 4A is a simplified, partial cross-sectional schematic view illustrating a plasma reactor in accordance with another embodiment of the invention.
Figure 4A:
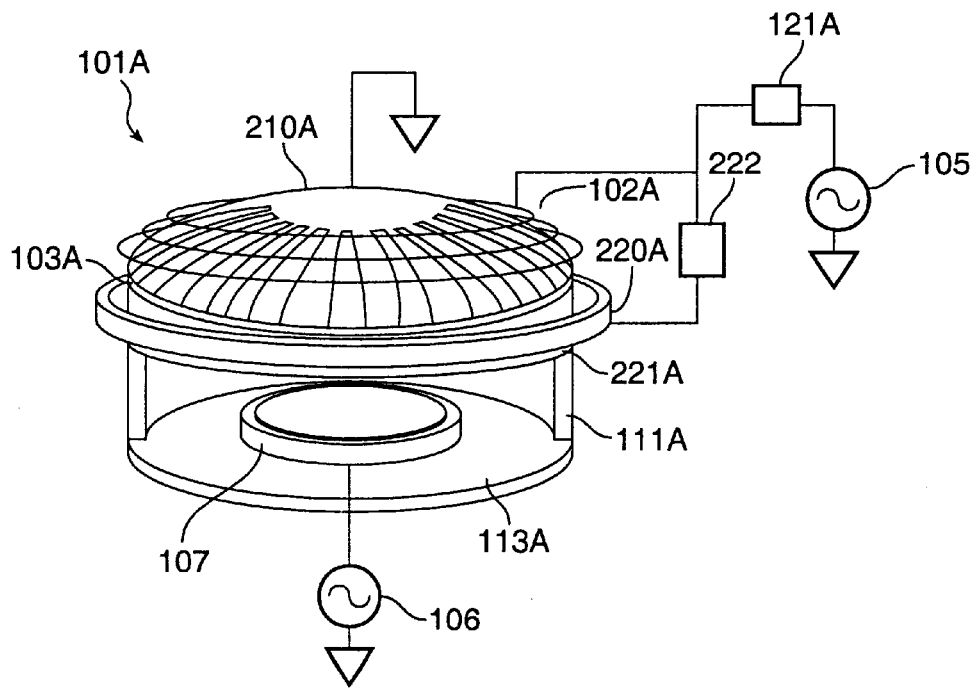

In FIGS. 4A and 4AA, another embodiment 101A of the chamber 101 of FIG. 1 is illustrated. The electrode 220A is disposed adjacent a sidewall portion 221A instead of the ceiling of the dome 103A. In this embodiment, the electrode 220A is a ring-like member encircling the cylindrical sidewall portion 221A. The sidewall portion 221A is made of a material such as quartz or a diamond-coated material which has low contaminant production characteristics. The sidewall portion 221A is supported by a lower side wall 111A and a bottom 113A. The pedestal 107 is biased by an RF signal supplied to the pedestal 107 by the bias power supply 106. The dome 103A is typically made of a material such as a ceramic which is resistant to erosion. It is noted that the dome 103A may be easier to manufacture than the dome 103 in FIG. 1 because the dome 103A is continuous. The Faraday shield 210A may also be continuous. In addition, the antenna 102A may be moved closer to the center because the center is no longer occupied by an electrode such as the electrode 220A in the embodiment of FIG. 1. An RF matching network 121A is coupled to the source power supply 105, and another RF matching network 123A is coupled to the bias power supply 106.

Figure 4B:
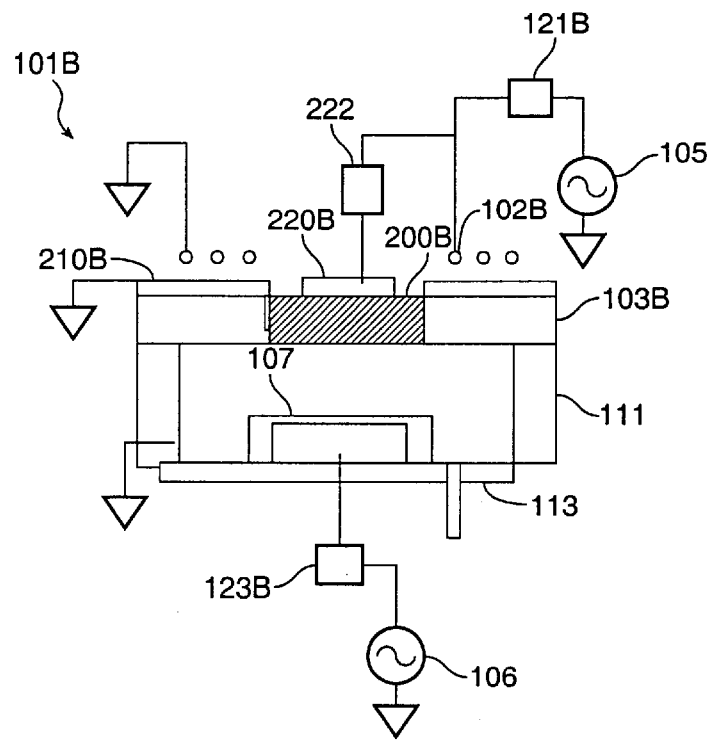
FIG. 4B is a simplified, partial cross-sectional schematic view illustrating a plasma reactor in accordance with another embodiment of the invention.
Figure 4B:
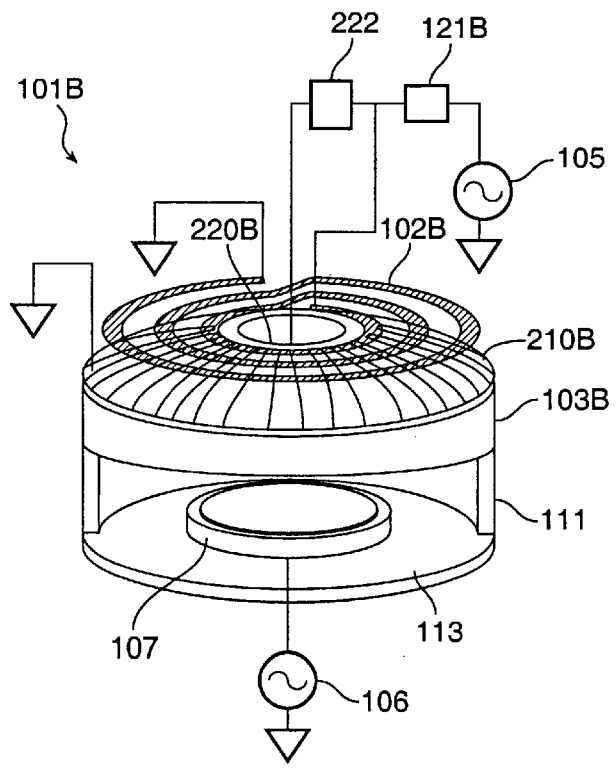

FIGS. 4B and 4BB show another chamber 101B having a generally flat top 103B with a generally flat Faraday shield 210B. The top 103B is typically made of a ceramic material, and has a central opening for accommodating a top insert 200B, which is typically made of quartz or the like. A flat spiral antenna 102B is located proximate the top 103B, and generally around and spaced from the central-region electrode 220B. Alternatively, the chamber top 103B maybe a laterally continuous ceramic or quartz dislike element. In addition, the spiral antenna 102B may be replaced by a plurality of concentric coils in an alternate embodiment. The chamber 101B includes a side wall 111 and a bottom 113. A pedestal 107 is disposed in the chamber 101B. An RF matching network 121B is coupled to the source power supply 105, and another RF matching network 123B is coupled to the bias power supply 106.

Figure 4C:
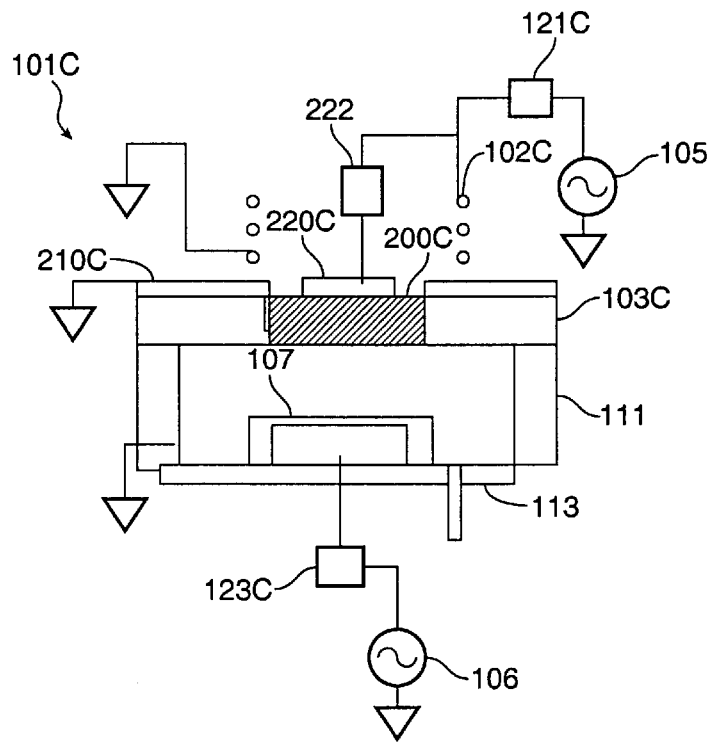
FIG. 4C is a simplified, partial cross-sectional schematic view illustrating a plasma reactor in accordance with another embodiment of the invention.

In FIG. 4C, another chamber 101C has a generally flat top 103C, a generally flat Faraday shield 210C, a top central insert 200C, and a central electrode 220C similar to those for the chamber 101B of FIG. 4B. Instead of the flat spiral antenna 102B, the chamber 101C includes a spiral coil stack 102C. Due to the stack configuration of the coil 102C, the power level in the portion of the coil 102C adjacent the flat top 103C is relatively low and will thus tend to generate relatively less capacitive coupling than a flat coil configuration. In an alternate embodiment, the spiral coil stack 102C may be replaced by a plurality of vertically spaced coils. The chamber 101C includes a side wall 111 and a bottom 113. A pedestal 107 is disposed in the chamber 101C. An RF matching network 121C is coupled to the source power supply 105, and another RF matching network 123C is coupled to the bias power supply 106.

Figure 4D:
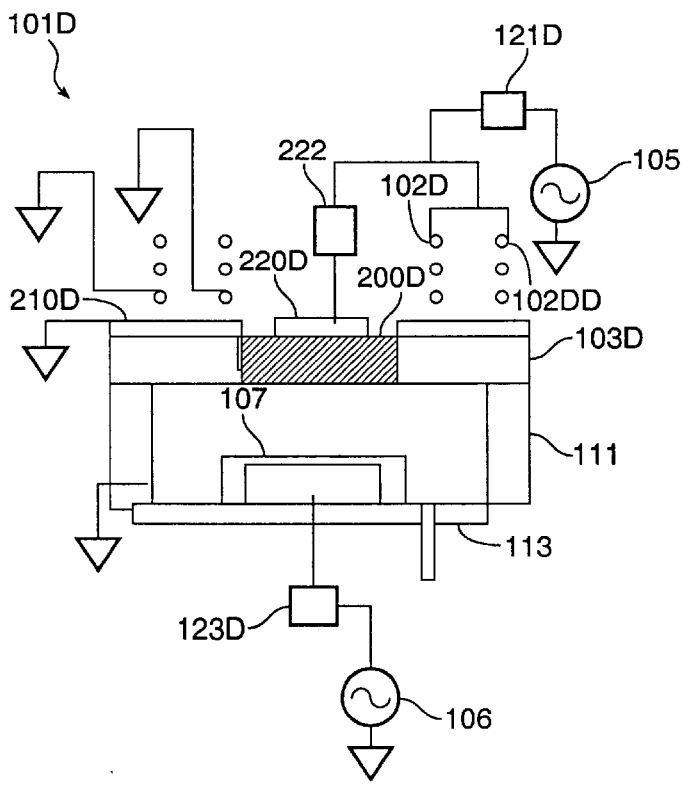
FIG. 4D is a simplified, partial cross-sectional schematic view illustrating a plasma reactor in accordance with another embodiment of the invention.

FIG. 4D shows another chamber 101D having an inner spiral coil stack 102D and an outer spiral coil stack 102DD which is spaced outwardly from and concentric with the inner coil stack 102D. The inner coil stack 102D is disposed close to the edge of the top central insert 200D, and the outer coil stack 102DD is disposed close to the side wall of the chamber 101D. Both stacks 102D, 102DD are used to inductively couple RF energy into the chamber 101D. The use of two stacks 102D, 102DD may produce a more uniform plasma. The generally flat Faraday shield 210D and central electrode 220D are similar to those for the chamber 101C. Although FIG. 4D shows a common RF source 105 for both stacks 102D, 102DD, an alternate embodiment may employ separate RF sources for the two stacks. In addition, different power levels may be provided in the two stacks 102D, 102DD. The chamber 101D includes a side wall 111 and a bottom 113. A pedestal 107 is disposed in the chamber 101D. An RF matching network 121D is coupled to the source power supply 105, and another RF matching network 123D is coupled to the bias power supply 106.

Figure 4E:
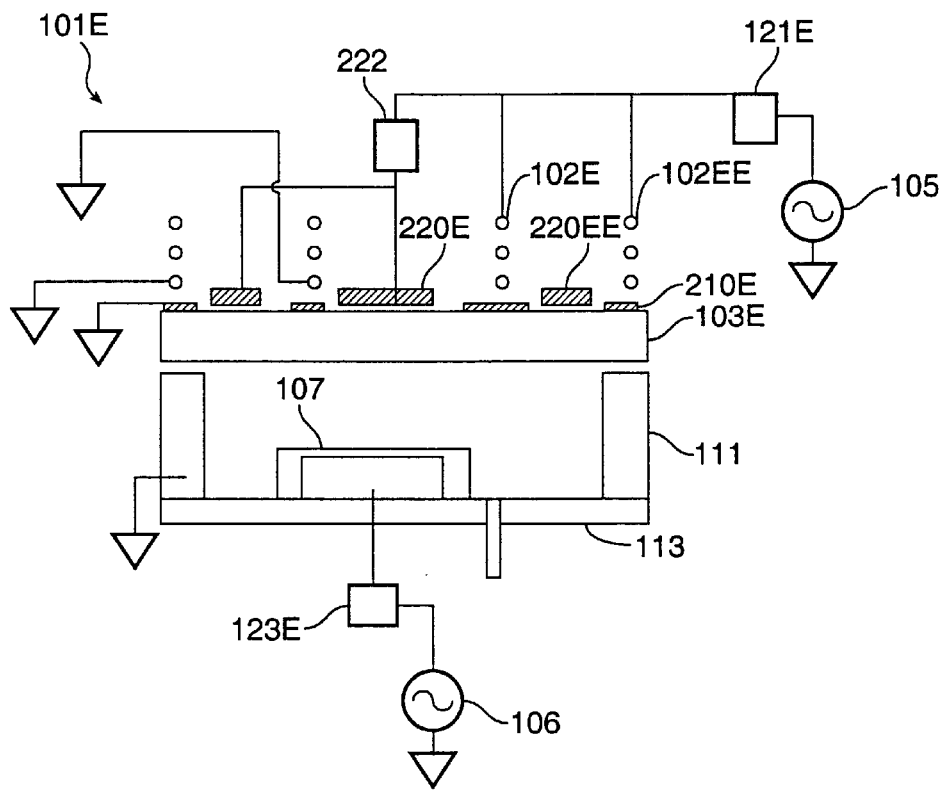
FIG. 4E is a simplified, partial cross-sectional schematic view illustrating a plasma reactor in accordance with another embodiment of the invention.

FIG. 4E shows another chamber 101E which also has an inner coil stack 102E and an outer coil stack 102EE similar to those for the chamber 101D. In addition to a central electrode 220E, the embodiment of FIG. 4E includes an intermediate electrode 220EE disposed between the inner and outer coil stacks 102E, 102EE. The intermediate electrode 220EE is an annular plate in the specific embodiment shown. Both electrodes 220E, 220EE are used to capacitively couple energy into the chamber 110E. The Faraday shield 210E includes an inner annular member disposed between the inner coil stack 102E and the flat top 103E, and an outer annular member disposed between the outer coil stack 102EE and the flat top 103E. The use of two stacks 102E, 102EE and two electrodes 220E, 220EE may produce a more uniform plasma. The chamber 101E includes a side wall 111 and a bottom 113. A pedestal 107 is disposed in the chamber 101E. An RF matching network 121E is coupled to the source power supply 105, and another RF matching network 123E is coupled to the bias power supply 106.

FIG. 4E shows a flat top 103E without quartz inserts adjacent the electrodes 220E, 220EE. Because the voltage is split between two electrodes 220E, 220EE, the capacitive coupling into the chamber 101E is less concentrated. This renders the ion bombardment from capacitive coupling less severe than other embodiments that provide a more concentrated capacitive coupling, so that the use of quartz inserts to alleviate particle contaminant production is less critical. Of course, top inserts made of quartz or the like may be provided adjacent the electrodes 220E, 220EE in an alternate embodiment of the chamber 101E.

C. Dynamic Inductive and Capacitive Coupling Control

Figure 5:
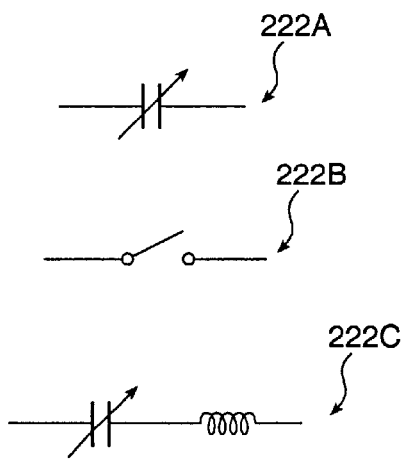
FIG. 5 show alternate embodiments of a coupler for controlling voltage flow to the electrode in the plasma reactor of FIG. 1.

In the embodiment shown in FIG. 1, the electrode 220 is coupled with the RF source 105. A coupler 222 is preferably used to provide dynamic control of the RF energy supplied to the electrode 220 to vary the dynamic voltage of the electrode 220. The remaining RF energy is directed to the antenna 102. The coupler 222 serves to apportion RF energy between the electrode 220 and the antenna 102 to control the relative levels of capacitive coupling and inductive coupling (i.e., substantially all inductive coupling, substantially all capacitive coupling, or a combination of inductive and capacitive coupling). The coupler 222 may be a variable voltage controller which can adjust both the phase and the magnitude of the RF voltage through the electrode 220. FIG. 5 shows examples of the coupler 222 as a variable capacitor 222A, an on/off relay switch 222B, or an LC series connection 222C. The on/off relay switch 222B can be used, for instance, to turn the capacitive coupling on during plasma ignition and off after ignition is achieved. The relay switch 222B may be used in conjunction with the variable capacitor 222A. While not illustrated in FIG. 5, it is to be appreciated that the circuits are controlled by the controller 140 and can be electronically controlled to vary the inductive coupling and capacitive coupling.

The coupler 222 advantageously permits dynamic control of the relative amount of capacitive coupling and inductive coupling during substrate processing. For example, the voltage to the electrode 220 may be increased in the beginning of the process so that the energy is coupled primarily capacitively to facilitate plasma ignition. During processing, the voltage to the electrode 220 may be decreased so that the RF energy coupled to the plasma is both inductive and capacitive, or is primarily inductive. The voltage on the electrode 220 may be turned off so that during processing coupling from the source power is essential inductive only, while the bias power supply 106 supplies capacitively coupled bias power.

The voltage may also be varied to help stabilize the plasma during processing where, for instance, processing conditions are changed or different process gases are used. An example would be a process for etching different layers on a substrate employing different process gases and conditions. The dynamic control desirably is provided in real time by using a computer algorithm.

The use of a Faraday shield 210 of FIG. 1 or similar devices for suppressing the capacitive coupling of the antenna 102 allows the capacitive coupling of RF energy into the chamber 101 to be more accurately controlled via the electrode 220. As discussed above, another way to minimize capacitive coupling by the antenna 102 is by increasing the spacing between the antenna 102 and the wall of the chamber 101. Dynamic control of the capacitive coupling can be achieved if the distance between the RF antenna 102 and the dome 103 is such that the effective capacitance between the antenna 102 and the plasma 130 is substantially less than the effective capacitance created by the series combination of the coupler 222 (such as the capacitor 222A in FIG. 5) connected between the antenna 102 and the electrode 220, and the capacitance between the electrode 220 and the plasma 130. Because the effective capacitance between the antenna 102 and the plasma 130 is approximately inversely proportional to the distance or thickness of the gap between the antenna 102 and the outer surface of the dome 103, the effective capacitance between the antenna 102 and the plasma 130 can be made small enough by increasing the spacing between the antenna 102 and the dome 103, for instance, to typically about 1 cm. A more precise determination of the minimum spacing between the antenna 102 and the dome 103 to achieve the dynamic control in absence of the use of a Faraday shield is achievable for any antenna configuration using the criterion of effective capacitance as described above.

As shown in FIG. 1, the chamber 101 may include a sensor 224 for monitoring the power supplied to the electrode 220, and may further include a sensor 226 for monitoring the power supplied to the antenna 102. In a specific embodiment, the sensor 224 measures the voltage in the electrode 220 and the sensor 226 measures the voltage and/or current in the antenna 102. The system controller 140 receives signals from the sensors 224, 226, and is coupled with the coupler 222 as well as the source power 105. Based on the measured voltages as feedback, the controller 140 can adjust the source power 105 and/or the coupler 222 dynamically to achieve the desired voltage in the electrode 220 or the desired split of RF power between the antenna 102 and the electrode 220.

Instead of, or in addition to, the sensors 224, 226, a sensor 229 may be provided for measuring the capacitive current through the plasma in the chamber 101. As shown in FIG. 1, the sensor 229 is coupled to the pedestal 107. Alternatively, the sensor 229 may be coupled to the chamber wall such as the sidewall 111 or the bottom 113. The sensor 229 is typically an RF current pickup sensor for measuring the current capacitively coupled from the electrode 220 through the plasma 130. The current sensor 229 provides feedback to the system controller 140 which can be used to vary the coupler 222 to adjust the capacitive coupling. In a specific embodiment, the measurement of the sensor 229 provides the RF voltage waveform of the RF current through the pedestal 107 to the system controller 140. The controller 140 uses the RF voltage waveform to adjust the coupler 222 to optimize the magnitude and phase of the RF voltage supplied to the electrode 220 to obtain the desired plasma ion energy and ion energy flux to the wafer 110.

The RF energy capacitively coupled into the chamber 101 of FIG. 1 by the electrode 220 can be used to facilitate igniting a plasma and/or to stabilize a plasma. For instance, it may be very difficult to ignite a plasma in an inductively coupled plasma reactor at very low chamber pressure (e.g., below about 4 milliTorr) without capacitive coupling. The system controller 140 can be configured to direct operation of the coupler 222 to ensure there is sufficient voltage in the electrode 220 to capacitively couple RF energy into the process chamber to provide reliable plasma ignition. In a specific embodiment, the RF energy is primarily capacitive during ignition.

Plasma ignition may be performed by applying RF power to the electrode 220 alone or applying RF power to both the electrode 220 and the antenna 102. If the bias power 106 is provided for biasing the wafer pedestal 107, the pedestal 107 can also be biased with RF power during plasma ignition.

Subsequent to ignition, the coupler 222 can be adjusted to lower the voltage in the electrode 220 so that the RF energy is both capacitive and inductive or primarily inductive during steady-state maintenance of the plasma. In a specific embodiment, for instance, the voltage in the electrode 220 is about 5000 volts for plasma ignition, and is about 0–3000 volts subsequent thereto. The voltage in the antenna 102 in a specific embodiment is about 3000 volts.

During processing, the voltage to the electrode 220 may be decreased so that the RF energy coupled to the plasma is both inductive and capacitive, or is primarily inductive. The dynamic voltage may also be varied to help stabilize the plasma during processing where, for instance, processing conditions are changed or different process gases are used. In one example, the system 100 employs a computer-readable program that includes a first set of instructions for controlling the gas panel 120 to introduce first process gases during a first time period into the chamber 101, a second set of instructions for controlling the inductive RF member 102 for inductively coupling energy into the chamber 101, a third set of instructions for controlling the power source 105 to supply energy to the electrode 220 for capacitively coupling energy into the chamber 101, and a fourth set of instructions for controlling the dynamic coupler 222 to vary the voltage of the electrode 220 to adjust the plasma 130 in the chamber 101 formed by the energy coupled into the chamber 101 for processing the substrate. The dynamic voltage may be varied to help stabilize the plasma during etching or deposition of a single layer. Moreover, one process may be carried out on a substrate at one dynamic voltage level and another process may be performed on the substrate at another dynamic voltage level to help stabilize the plasma.

D. System Monitoring and Control

As seen in FIG. 1, a process monitor 108 monitors conditions within process chamber 101. The process monitor 108 can be any sensor, or combination of sensors, for measuring a condition that is dependent on the process occurring within chamber 101. By way of example, the process monitor 108 may be an Optical Emission Spectrometer (OES). The OES monitors emission of radiation from the plasma 130. Such radiation is dependent on the progress of the process occurring in process chamber 101. Alternatively, the process monitor 108 could include an interferometer for measuring elevations such as the depth of trenches etched into a surface of the wafer 110. Such an interferometer measures the depth of the trenches by interference of light reflected from the top and bottom of the trenches. If the process monitor 108 is an OES or interferometer, radiation from within chamber 101 is coupled to the process monitor 108 through a transparent aperture such as the quartz dome insert 200. Alternatively a separate window can be provided in the top 103 or sidewall 111 for this purpose.

The process monitor 108 is also useful in monitoring the plasma 130 and provide data to the controller 140 to adjust the capacitive coupling and inductive coupling of energy into the process volume 104. For instance, the stability of the plasma may be monitored by observing the optical intensity of the plasma to detect any abrupt fluctuations that may be indicative of instability. The coupler 222 can be dynamically adjusted to vary the apportioning of energy capacitively and inductively coupled into the process volume 104 to maintain plasma stability.

The process monitor 108 and various components of system 100 are coupled to the system controller 140. The controller 140 includes hardware to provide the necessary signals to initiate, monitor, regulate, and terminate the processes occurring in the process chamber 101.

Figure 6:
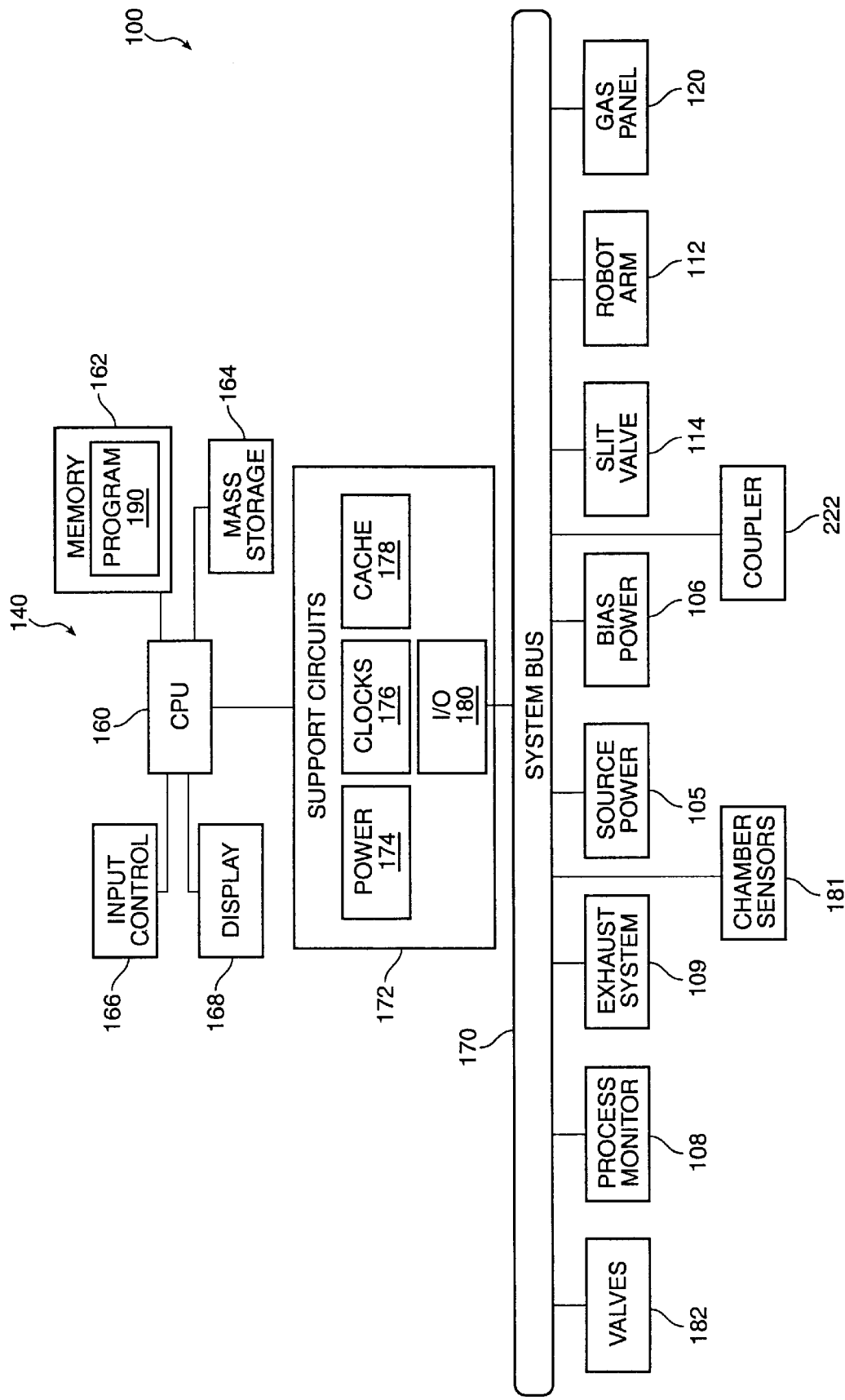
FIG. 6 is a block diagram of the semiconductor wafer processing system of FIG. 1.

The method of the present invention can be implemented in a system that is controlled by a processor based system controller such as the controller 140 of FIG. 1. FIG. 6 shows a block diagram of a processing system 100, such as that depicted in FIG. 1, having such a system controller 140 that can be employed in such a capacity. The system controller unit 140 includes a programmable central processing unit (CPU) 160 that is operable with a computer-readable memory 162, a mass storage device 164, an input control unit 166, and a display unit 168. The system controller 140 further includes well-known support circuits 172 such as power supplies 174, clocks 176, cache 178, input/output (I/O) circuits 180 and the like. The controller 140 also includes hardware for monitoring wafer processing through sensors 181 in the chamber 101. Such sensors 181 measure system parameters such as wafer temperature, chamber atmosphere pressure and the like. All of the above elements are coupled to a control system bus 170.

As shown in FIG. 6, the memory 162 contains instructions that the CPU 160 executes to control the operation of the processing system 100. The instructions in the memory 162 are in the form of program code such as a program 190 that implements the method of the present invention. The program code 190 may conform to any one of a number of different programming languages. For example, the program code can be written in C, C++, BASIC, Pascal, or a number of other languages. The computer program 190 may include a number of different subroutines. For example, in one specific embodiment, the program 190 includes a process selector subroutine, a process sequencer subroutine and chamber manager subroutines for multiple chambers in a multichamber system. The program 190 also includes subroutines to control individual components of each chamber 101 including, for example, a substrate positioning subroutine, a process gas control subroutine, a pressure control subroutine, a temperature control subroutine and a plasma control subroutine among others. Those having ordinary skill in the art will readily recognize that other chamber control subroutines can be included depending on what processes are to be performed in the process chamber 101.

The process selector subroutine identifies (i) the desired process chamber (if the chamber 101 is part of a multichamber processing system) and (ii) the desired set of process parameters needed to operate the process chamber for performing the desired process. The process parameters for performing a specific process relate to process conditions such as, for example, process gas composition and flow rates, temperature, pressure, plasma conditions such as RF power levels, cooling gas pressure, and chamber wall temperature. These parameters are provided to the user in the form of a recipe, and can be entered utilizing the input control interface 166.

The process sequencer subroutine includes program code for accepting the identified process chamber and set of process parameters from the process selector subroutine and for controlling operation of the various process chambers in a multichamber system. Once the sequencer subroutine determines which process chamber and process set combination is going to be executed next, the sequencer subroutine initiates execution of the process set by passing the particular process set parameters to a particular chamber manager subroutine that controls multiple processing tasks in the particular process chamber according to the process set determined by the sequencer subroutine. In operation, the chamber manager subroutine selectively schedules or calls the process component subroutines in accordance with the particular process set being executed. Typically, the chamber manager subroutine monitors the various chamber components, determines which components need to be operated based on the process parameters for the process set to be executed, and causes execution of individual chamber component subroutines responsive to the monitoring and determining steps.

Each of the chamber component subroutines is implemented to control operation of the particular component. For example, the plasma control subroutine would include program code for controlling chamber components that are used to generate and control the plasma 130 in the chamber 101, including the source power 105, bias power 106, coupler 222, sensors 224, 226, 229, etc. The pressure control subroutine would include program code for controlling the pressure in the chamber 101 by regulating the size of the opening of the throttle valve in the vacuum pumping system of the chamber based on the target pressure level received as an input parameter.

Referring again to FIG. 6, the mass storage device 164 stores data and instructions and retrieves data and program code instructions from a processor readable storage medium, such as a magnetic disk or magnetic tape. For example, the mass storage device 164 can be a hard disk drive, floppy disk drive, tape drive, or optical disk drive. The mass storage device 164 stores and retrieves the instructions in response to directions that it receives from the CPU 160. Data and program code instructions that are stored and retrieved by the mass storage device 164 are employed by the processor unit 160 for operating the processing system 100. The data and program code instructions are first retrieved by the mass storage device 164 from a medium and then transferred to memory 162 for use by CPU 160.

The input control unit 166 couples a data input device, such as a keyboard, mouse, or light pen, to the processor unit 160 to provide for the receipt of a chamber operator's inputs. The display unit 168 provides information to a chamber operator in the form of graphical displays and alphanumeric characters under control of the CPU 160.

The control system bus 170 provides for the transfer of data and control signals between all of the devices that are coupled to the control system bus 170. Although the control system bus 170 is displayed as a single bus that directly connects the devices in the CPU 160, the control system bus 170 can also be a collection of buses. For example, the display unit 168, input control unit 166 and mass storage device 164 can be coupled to an input-output peripheral bus (not shown), while the CPU 160 and memory 162 are coupled to a local processor bus (not shown). The local processor bus and input-output peripheral bus are coupled together to form the control system bus 170.

The system controller 140 is coupled to the elements of the processing system 100 employed in, for example, etch processes via the system bus 170 and I/O circuits 180. These elements include a plurality of valves 182 (such as valve 124 of FIG. 1), process monitor 108, vacuum pumping system 109, source power supply 105, bias power supply 106, slit valve 114, gas panel 120, robot arm 112, chamber sensors 181 (including sensors 224, 226, 229), and coupler 222.

The system controller 140 provides signals to the various chamber elements that cause these elements to perform desired operations in order to implement a desired process in the chamber 101.

It is appreciated that the invention is applicable to other high density plasma (HDP) or inductively coupled plasma (ICP) semiconductor wafer processing system as well as to other types of plasma etching systems. Furthermore, while the invention is described herein as being implemented in software and executed upon a general purpose computer, those of skill in the art will realize that the invention could be implemented using hardware such as an application specific integrated circuit (ASIC) or other hardware circuitry. As such, it should be understood that the invention can be implemented, in whole or in part, in software, hardware or both. Those skilled in the art will also realize that it would be a matter of routine skill to select an appropriate computer system to control the substrate processing system 100.

II. Experiments and Test Results

The use of a Faraday shield 210 of FIG. 1 or similar devices for suppressing the capacitive coupling of the antenna 102 allows the capacitive coupling of RF energy into the chamber 101 to be more accurately controlled. As discussed above, another way to minimize capacitive coupling by the antenna 102 is by increasing the spacing between the antenna 102 and the wall of the chamber 101. This permits more precise control of the plasma ion energy and process reproducibility by allowing capacitive coupling to be independently adjustable through the electrode 220.

In addition, the Faraday shield 210 significantly reduces the production of particles and contaminants due to plasma erosion, more particularly ion bombardment, of the dome material. Several experiments were conducted to illustrate this feature. In the first experiment, a chamber had a dome made of alumina ($Al_2O_3$) and no Faraday shield was used. In a second experiment, a Faraday shield was used with the alumina dome. The third experiment involved a dome made of a ceramic composition of $Al_2O_3$ (about 60–65% by weight) and $Y_2O_3$ (about 35–40% by weight) with a Faraday shield. A plasma was ignited and sustained in each experiment. A clean wafer was placed inside the chamber in each test to collect contaminant particles produced in plasma processes at the same power level and process conditions. After termination of the plasma, the wafer was then removed from the chamber and post-processed to measure the amount of aluminum contamination.

In the first experiment for a dome made of alumina without a Faraday shield, the aluminum contamination is about $1.2 \times 10^{14}$ atoms/cm$^2$. When a Faraday shield is used in the second experiment, the aluminum contamination drops to about $1.2 \times 10^{13}$ atoms/cm$^2$. When a Faraday shield is used for a dome made of the ceramic composition in the third experiment, the aluminum contamination is reduced to about $6.8 \times 10^{12}$ atoms/cm$^2$. Thus, the use of an erosion-resistant material combined with a Faraday shield results in a substantial decrease in contaminant particle production.

In one embodiment of the invention, a single RF power source 105 is used to supply power to the antenna 102 and the electrode 220 to minimize the number of RF sources. The coupler 222 serves to apportion the RF power between the antenna 102 and the electrode 220.

The coupler 222 further allows the RF energy capacitively coupled into the chamber 101 to be dynamically varied. The use of the sensors 224, 226 and/or 229 provides feedback to the system controller 140 which can direct operation of the coupler 222 in real time to adjust the relative RF energies capacitively coupled and electromagnetically coupled into the chamber 101 to provide the desired plasma conditions.

Figure 7:
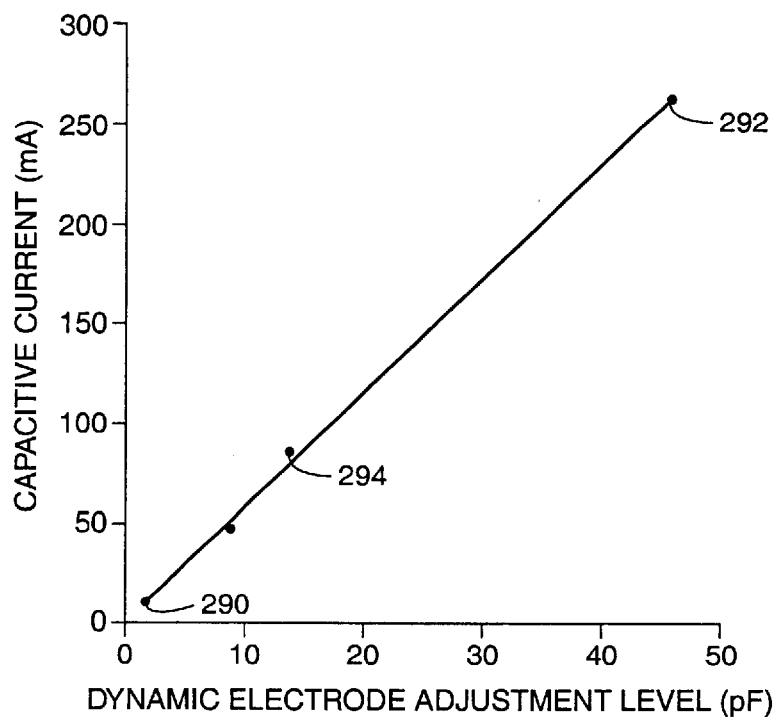
FIG. 7 shows experimental results illustrating control of capacitive coupling using the semiconductor processing system of the present invention.

FIG. 7 shows results from experiments involving variation of the capacitive current through the plasma 130 and the chamber 101 by adjusting the coupler 222 to change the voltage supplied to the electrode 220. The coupler 222 in the tests is a variable capacitor 222A (FIG. 5) adjustable to vary the capacitance in pico-Farads (pF). The capacitive current can be measured by the sensor 229 as shown in FIG. 1. Adjustment of the coupler 222 to vary the capacitive current controls the capacitive coupling into the chamber 101.

By simple adjustment of the variable capacitor 222A in the present system 100, one can simulate a chamber that is essentially completely shielded from capacitive coupling by dropping the capacitive current to approximately zero at point 290, as shown in FIG. 7. This is accomplished by blocking energy flow to the electrode 220. FIG. 7 also shows a point 292 where the capacitive coupling is a significant contributor to the plasma with a capacitive current of about 265 mA. The variable capacitor 222A can be used to dynamically vary the capacitive coupling.

In contrast, in a conventional system that does not employ a mechanism such as a Faraday shield 210 to suppress the capacitive coupling from the inductive antenna, the minimum capacitive current is provided by capacitive coupling from the antenna. As shown in FIG. 7, point 294 represents the capacitive current at about 80 mA in a conventional system with no Faraday shield and using the same RF power. The 80 mA is the capacitive current produced from the capacitive coupling of the antenna. Consequently, even if an electrode is provided in the conventional system to couple additional capacitive energy into the chamber, the capacitive current cannot fall below 80 mA. Therefore, the range of operation is limited as compared with the present system 100.

It is noted that the capacitive current in a system employing an electrode (about 265 mA as represented by point 292) can be increased to more than 3 times the current generated in a conventional system without an electrode (about 80 mA) at the same RF power level. As discussed in more detail below, this allows one to expand the stable operating regime of the plasma and to provide added flexibility to adjust the capacitive coupling to maintain a stable plasma during processing.

In some processes, the capacitive coupling can be adjusted to stabilize the plasma 130. The process conditions such as temperature and pressure may be changed or the process gas mixture may be altered during processing, for instance, for etching or depositing different layers on a substrate. Different amounts of capacitive coupling may be desirable for maintaining a stable plasma. The present system allows dynamic, realtime adjustment of the capacitive coupling and inductive coupling to enhance plasma stability and process optimization.

Figure 8:
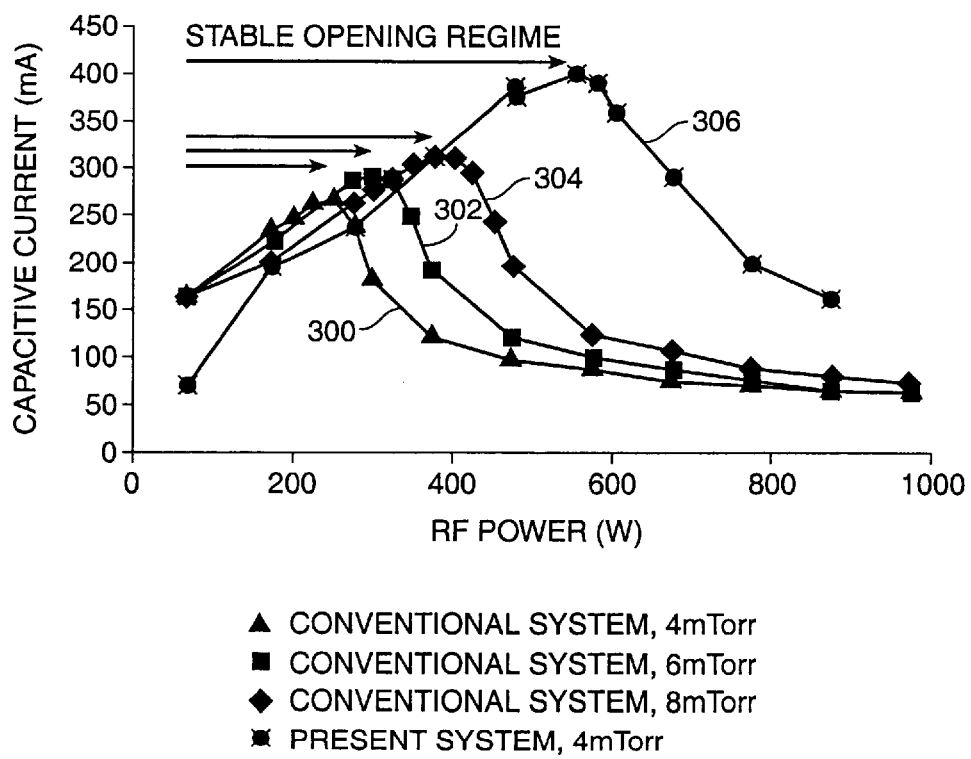
FIG. 8 shows experimental results illustrating control of plasma stability using the semiconductor processing system of the present invention.

FIG. 8 shows experimental results illustrating control of plasma stability by controlling the capacitive coupling. The specific experiments involved a four-gas silicon etch process using HBr, $Cl_2$, $CF_4$, and $O_2$, but the plasma control can be utilized for other processes. The gas composition used is a typical composition in plasma etch processes.

The first set of tests were performed with a conventional system with no dynamic control of the capacitive coupling, and no mechanism such as a Faraday shield to suppress the capacitive coupling of the antenna. The results are represented by curves 300, 302, and 304 at different pressure levels of 4 milliTorr, 6 milliTorr, and 8 milliTorr, respectively. In this chamber arrangement, the capacitive current was produced by capacitive coupling of the inductive member or antenna.

Another test employed the system 100 as illustrated in FIG. 1 in which a Faraday shield was used to eliminate capacitive coupling of the antenna. The capacitive coupling was produced by the electrode 220 coupled to the same RF power source 105 for the antenna 102 so that the RF power was apportioned between the electrode 220 and the antenna 102. This produced curve 306 at a pressure of 4 milliTorr.

The optical intensity of the plasma inside the chamber was observed to detect any abrupt fluctuations signifying plasma instability. Plasma instability might also be detected by observing abrupt changes in the position of RF matching elements in a matching network used to match the output impedance of the RF generator with the RF coil antenna.

The capacitive current in each case increased initially as the RF power increased. After reaching a peak capacitive current level, the current dropped with a continued increase in RF power. A stable plasma range was observed where the capacitive current increased with an increase in RF power (to the left of the peaks), while instability was observed where the capacitive current decreased with an increase in RF power (to the right of the peaks). It is noted that a stable operating regime is present in each of the curves 300–306. In each case, plasma stability occurs when the capacitive current and the RF power both increase. It is believed that the plasma is stable when capacitive current and the RF power both increase due to restorative forces from positive feedback of the capacitive coupling (either from the inductive member in the conventional system or from the electrode in the present system) returning the plasma to equilibrium.

For the curves 300, 302, and 304 using the conventional system without a Faraday shield and without independent control of the capacitive coupling, the stable operating regimes are represented by maximum RF power levels of about 230 W, 300 W, and 380 W, respectively. The increase in pressure from 4 milliTorr to 8 milliTorr results in an increase in the range of the stable RF power levels from a maximum of about 230 W at 4 mTorr to about 380 W at 8 mTorr.

For the curve 306, the ability to control the capacitive coupling in the present system 100 allows one to operate in the stable plasma regime to achieve improved processing. During substrate processing, the capacitive coupling can be independently and dynamically controlled using the present system to keep the operating regime to the left of the peak to maintain stability.

Moreover, the stable operating regime can be enlarged by independently controlling the capacitive coupling. When the capacitive coupling is independently controlled, the stable operating regime at 4 milliTorr expands to a maximum RF power level of about 550 W (curve 306). This maximum stable RF power level is about 2.4 times the maximum level obtained for a similar process performed using a conventional chamber without capacitive coupling control (curve 300 at a maximum level of about 230 W). Thus, the stable operating regime is significantly greater when a Faraday shield and an electrode are used to provide independent control of the capacitive coupling.

Capacitive coupling can affect other process characteristics in addition to plasma ignition and stability. For example, FIGS. 9–13 present experimental results illustrating the effect of capacitive coupling on silicon etch of a gate structure using the system 100 (FIG. 1). The coupler 222 was a variable capacitor 222A (FIG. 5) adjustable to vary the capacitance dynamically under control of the controller 140. The capacitance levels selected were about 5 pF and about 50 pF. The dome insert 200 also contributes to the overall capacitance. The capacitance levels each represent total capacitance of the capacitor 222A and the dome insert 200.

The experiments included three sets of etch processes, with each set being carried out at the two selected capacitance levels. During the main etch process, the first set of processes involved main etch (ME) using $Cl_2$, HBr, and $O_2$ gases. The source power 105 was about 475 W, the bias power 106 was about 60 W, and the pressure was about 4 milliTorr. The second set of processes were also main etch processes that were similar to the first set of processes, except that the bias power 106 was set to about 5 W. The third set of processes involved over-etch (OE) using a mixture of HBr and $O_2$. During the over-etch process, the source power 105 was about 600 W, the bias power 106 was about 60 W, and the pressure was about 60 milliTorr. The temperature of the wafer 110 in each case was around 40° C.

Figure 9:
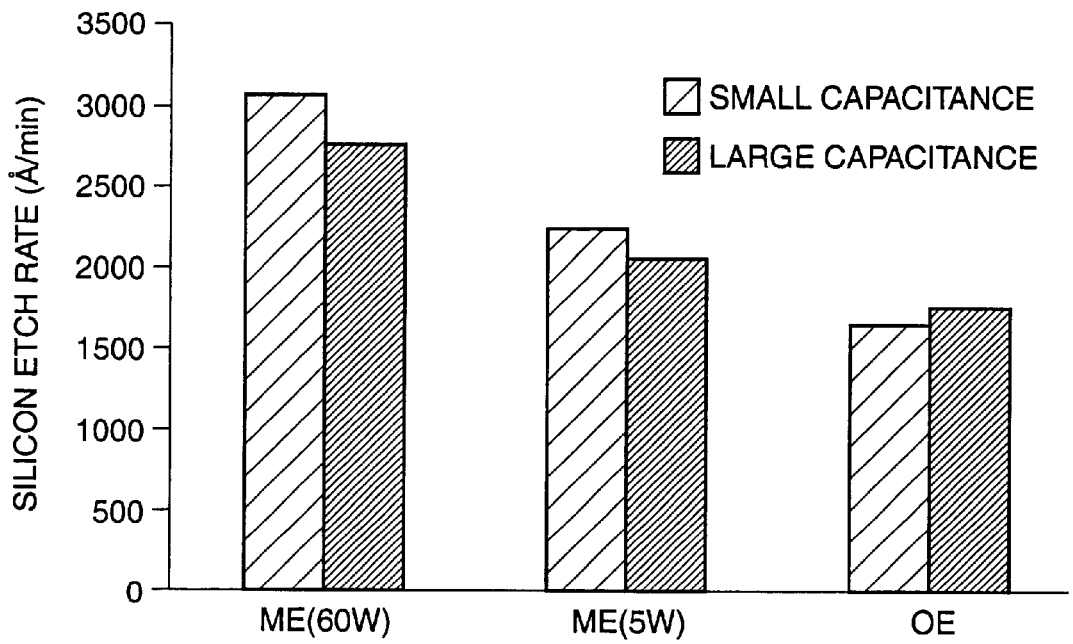
FIG. 9 shows experimental results illustrating the effect of capacitive coupling on silicon etch rate for a gate structure.
Figure 10:
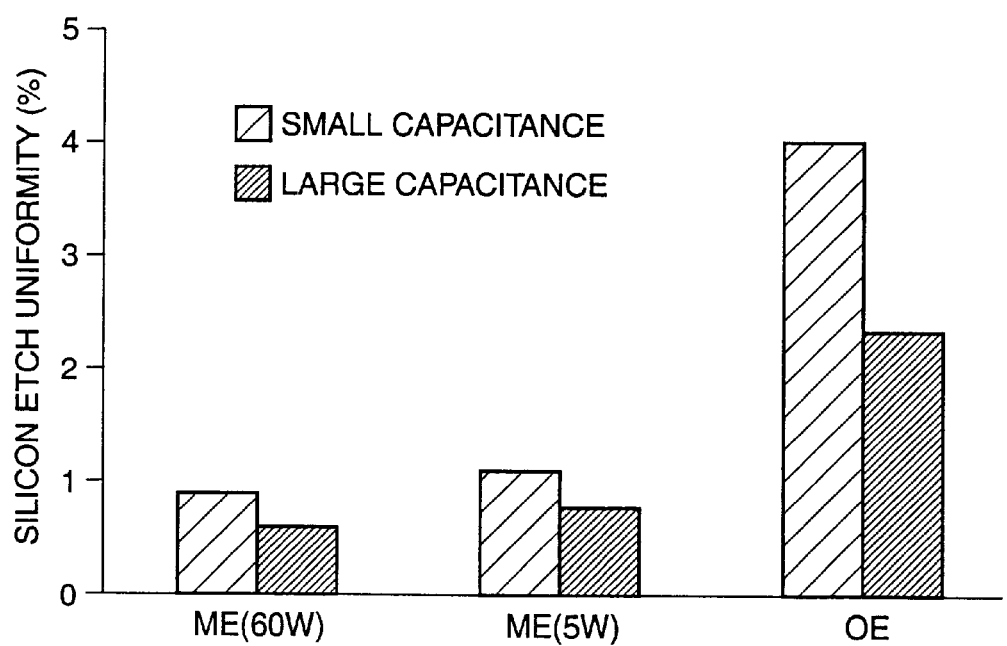
FIG. 10 shows experimental results illustrating the effect of capacitive coupling on silicon etch uniformity for a gate structure.

As shown in FIG. 9, the silicon etch rate for the three sets of processes changed only slightly (less than about 10%) by varying the capacitive coupling between the small capacitance of about 5 pF and the large capacitance of about 50 pF. On the other hand, capacitive coupling had a significant effect on silicon etch uniformity, as seen in FIG. 10. When the capacitance level was increased from about 5 pF to about 50 pF, the uniformity improved from about 1% to about 0.6% of standard deviation for the main etch process which used 60 W bias power (ME(60 W)), and improved from about 1.2% to about 0.8% for the main etch process which used 5 W bias power (ME(5 W)). For the over-etch (OE) process, the increase in capacitive coupling from the small capacitance of about 5 pF to the large capacitance of about 50 pF improved the uniformity from about 4.1% to about 2.4%. In each case, the uniformity was improved by using the larger capacitance.

Figure 11:
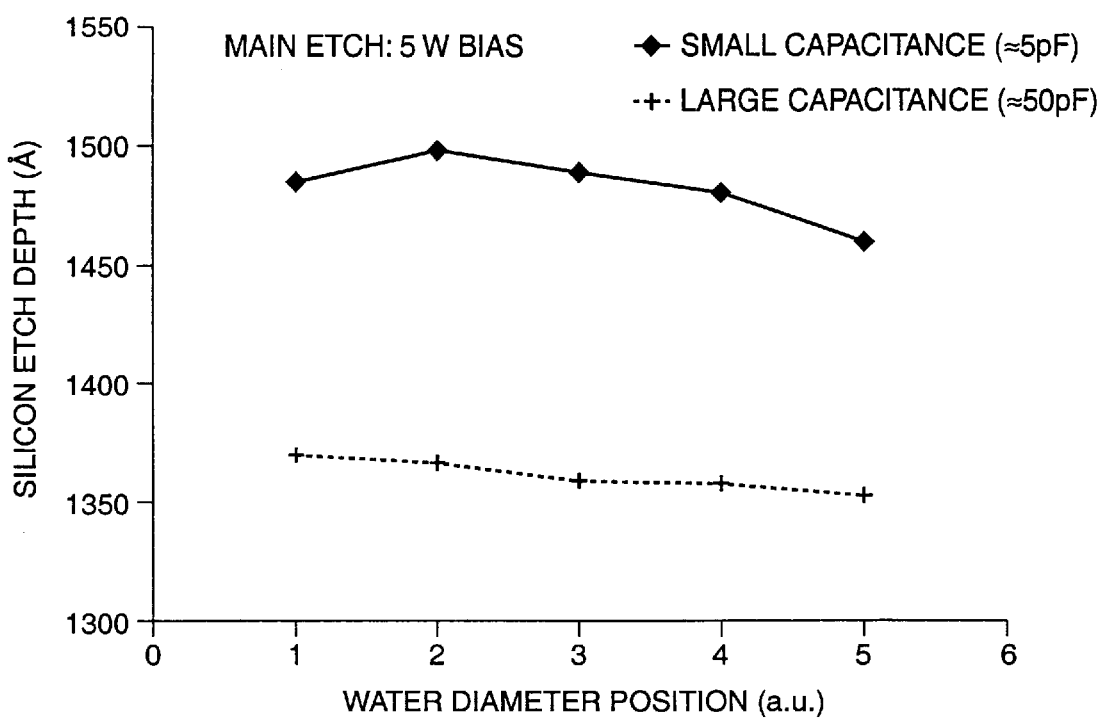
FIG. 11 shows experimental results illustrating the effect of capacitive coupling on silicon etch uniformity across the wafer for main etch of a gate structure.

The uniformity across the wafer was also improved by using the large capacitance in the main etch at 5 W bias power, as shown in the plot of silicon etch depth for a 30-second etch versus wafer position in arbitrary units for a 200-mm wafer in FIG. 11. The trends of uniformity were similar between the large capacitance and small capacitance. FIG. 11 illustrates the improved wafer uniformity achieved by using the large capacitance during the main etch process with source power of about 475 W and bias power of about 5 W. When a small capacitance (about 5 pF) was employed, the etch depth varied by about 50 Å. In contrast, when a larger capacitance (about 50 pF) was used, the etch depth varied by only about 10 Å.

Figure 12:
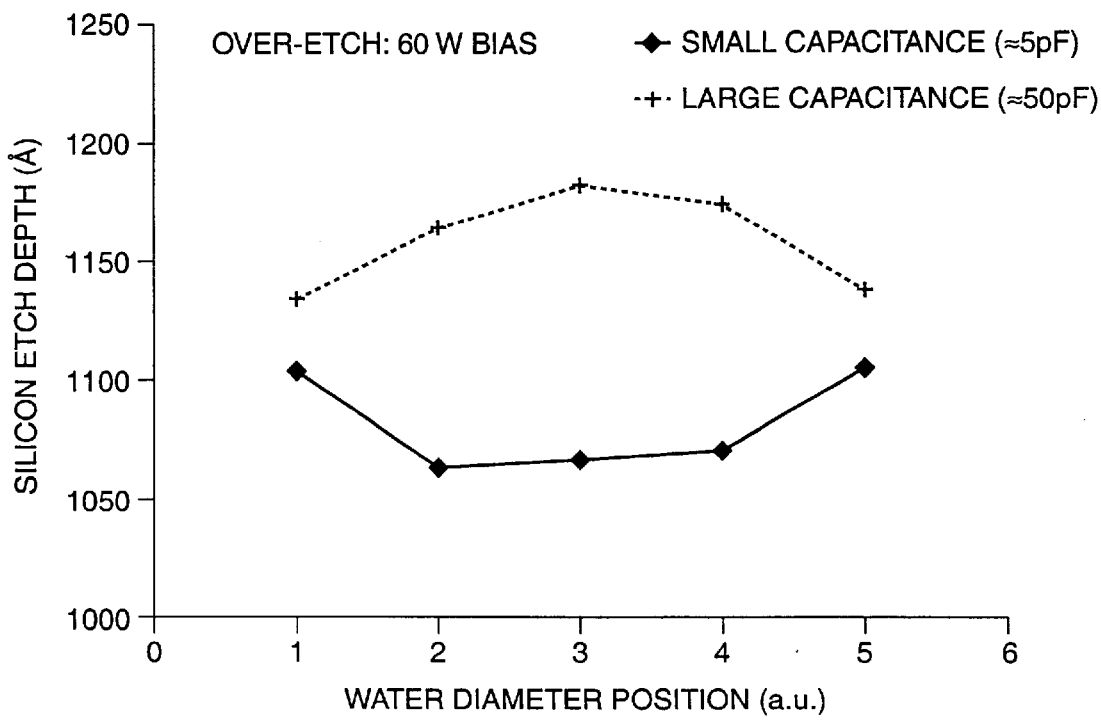
FIG. 12 shows experimental results illustrating the effect of capacitive coupling on silicon etch uniformity across the wafer for over-etch of a gate structure.

On the other hand, the over-etch processes yielded different trends of uniformity for the two capacitance levels, as seen in FIG. 12. At the small capacitance of about 5 pF, the etch depth was higher near the wafer edge than in the center. At the large capacitance of about 50 pF, the etch depth was lower near the wafer edge than in the center. It is believed that the process can be tuned by adjusting the capacitive coupling to obtain a more uniform etch depth across the wafer that falls between the small capacitance curve and the large capacitance curve of FIG. 12.

Figure 13:
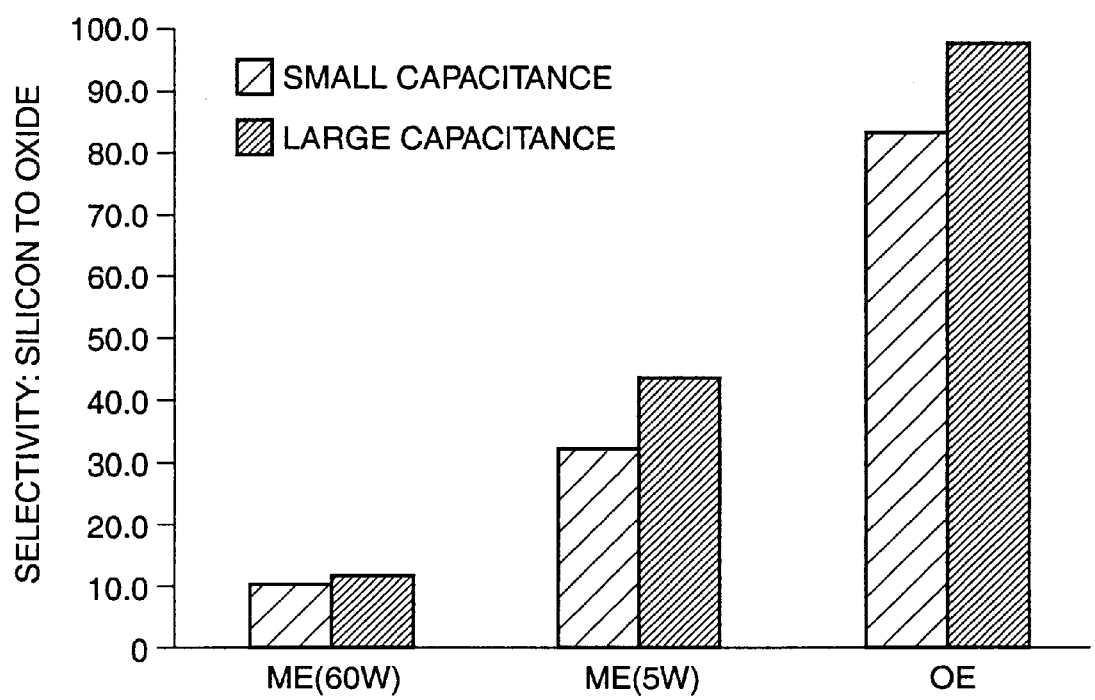
FIG. 13 shows experimental results illustrating the effect of capacitive coupling on silicon-to-oxide etch selectivity for a gate structure.

FIG. 13 shows improvements in silicon-to-oxide etch selectivity when the large capacitance was used. Silicon-to-oxide etch selectivity is the ratio of the etch rate for silicon and the etch rate for oxide. For the main etch at 60 W bias power, the selectivity increased slightly from about 10 to about 11. The increase in selectivity was more substantial for the main etch at 5 W bias power from about 31 to about 43. In the over-etch process where a high degree selectivity was desirable, the increase in capacitance from about 5 pF to about 50 pF raised the selectivity from about 83 to about 97.

Figure 14:
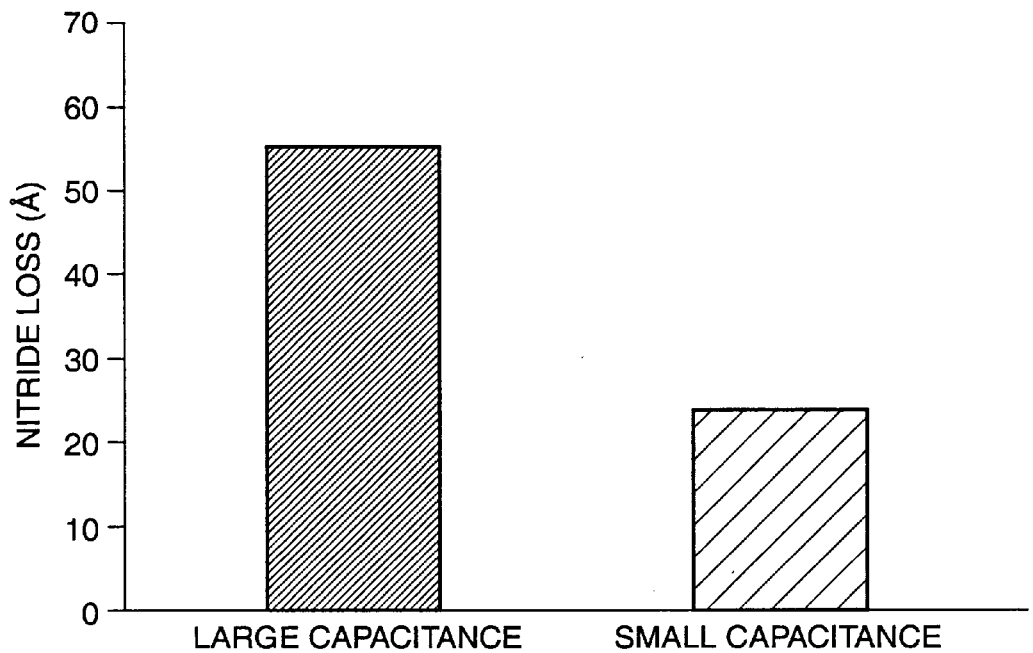
FIG. 14 shows experimental results illustrating the effect of capacitive coupling on nitride loss in a recess etch process.
Figure 15:
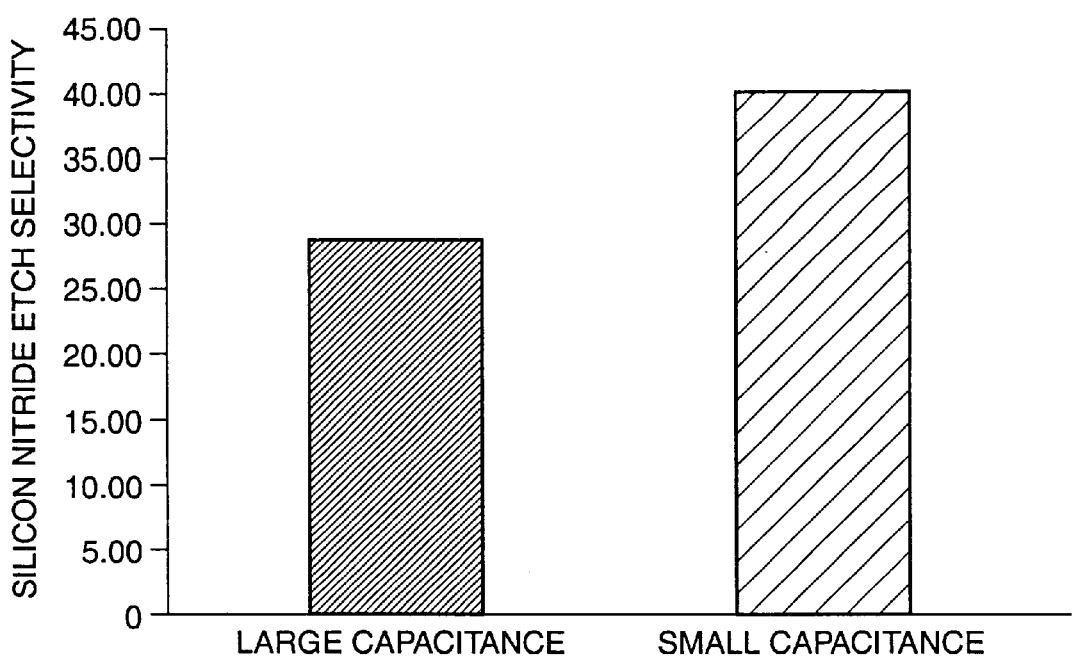
FIG. 15 shows experimental results illustrating the effect of capacitive coupling on silicon-to-nitride etch selectivity in a recess etch process.

While FIGS. 9–13 show that the use of a large capacitance improved uniformity and selectivity in certain processes, FIGS. 14 and 15 indicate that the use of a small capacitance of about 5 pF may be desirable in other processes. FIGS. 14 and 15 show results of using large and small capacitance during a recess etch process conducted for a 60 seconds using $SF_6$ at a pressure of about 10 milliTorr, a source power of about 100 W, and no bias power. As illustrated in FIG. 14, the recess etch process conducted with the small capacitance of about 5 pF yielded a lower nitride loss than the same process conducted with the high capacitance of about 50 pF. As illustrated in FIG. 15, the recess etch process conducted with the small capacitance of about 5 pF produced a process with a higher silicon-to-nitride selectivity. The small capacitance produced a selectivity of about 42 compared to a selectivity of about 29 for a similar process conducted with a large capacitance of about 50 pF.

The results of FIGS. 9–15 demonstrate that the capacitive coupling can be adjusted to produce more desirable results, such as improved uniformity and selectivity. The effect of capacitive coupling depends on the particular process. Advantageously, the present invention provides a coupler 222 that can be dynamically controlled to vary the capacitive coupling via the electrode 220 in order to achieve the desired characteristics for different processes.

It is to be understood that the above description is intended to be illustrative and not restrictive. Many embodiments will be apparent to those of skill in the art upon reviewing the above description. By way of example, a separate power source may be used to supply power to the electrode 220. A different Faraday shield may be used to suppress the capacitive coupling of the antenna 102. The scope of the invention should, therefore, be determined not with reference to the above description, but instead should be determined with reference to the appended claims along with their full scope of equivalents.

What is claimed is:

1. A plasma reactor for processing a substrate, the plasma reactor comprising:
   a chamber defining a plasma processing region therein, the chamber including a chamber wall, a first portion of the chamber wall made of a first chamber wall dielectric material, a second portion of the chamber wall made of a second chamber wall dielectric material different from the first chamber wall dielectric material;
   a substrate support disposed in the chamber for supporting a substrate;
   a power source;
   an inductive RP member being coupled to the power source and being disposed adjacent the first portion of the chamber wall; and
   a capacitively coupled electrode disposed adjacent the second portion of the chamber wall, the electrode being energized with a voltage, the electrode being spaced from the substrate support and be spaced from the inductive RE member.

2. The plasma reactor of claim 1 wherein the electrode is disposed outside of the chamber.

3. The plasma reactor of claim 1 wherein the first chamber wall material is resistant to plasma erosion.

4. The plasma reactor of claim 1 wherein the first chamber wall material is more resistant to plasma erosion than the second chamber wall material.

5. The plasma reactor of claim 1 wherein the second chamber wall material has a lower contamination yield than the first chamber wall material.

6. The plasma reactor of claim 1 wherein the first chamber wall material comprises a ceramic compound or a ceramic composition including a ceramic compound and an oxide of Group IIIB metal.

7. The plasma reactor of claim 1 wherein the second chamber wall material comprises quartz.

8. The plasma reactor of claim 1 wherein the electrode is coupled with the power source for the inductive RF member, and further comprising a dynamic coupler coupled with the power source for variably apportioning power supplied to the electrode and the inductive RF member.

9. The plasma reactor of claim 1 wherein the inductive RF member comprises an inductive coil.

10. The plasma reactor of claim 9 further comprising a shield disposed between the inductive coil and the chamber wall of the chamber to suppress capacitive coupled energy from the inductive coil into the chamber.

11. The plasma reactor of claim 10 wherein the shield is a Faraday shield.

12. The plasma reactor of claim 11 wherein the Faraday shield comprises a full shield continuously covering the space between the inductive coil and the chamber wall.

13. The plasma reactor of claim 11 wherein the Faraday shield comprises an electrically insulative shell and a plurality of electrically conductive portions spaced from each other.

14. The plasma reactor of claim 13 wherein the plurality of electrically conductive portions comprise a plurality of conductive strips oriented generally transverse in direction to windings of the inductive coil.

15. The plasma reactor of claim 13 wherein the electrically insulative shell comprises polyimide and the plurality of electrically conductive portions include a plurality of copper portions attached to the shell.

16. The plasma reactor of claim 1 further comprising a variable voltage controller coupled with the electrode to adjust said voltage.

17. The plasma reactor of claim 16 wherein the electrode is coupled with the power source for the inductive RF member.

18. The plasma reactor of claim 17 wherein the variable voltage controller is coupled with the power source for variably apportioning power supplied to the electrode and the inductive RF member.

19. The plasma reactor of claim 16 further comprising an electrode sensor coupled with the electrode for measuring the voltage in the electrode and a controller coupled with the electrode sensor and the variable voltage controller for monitoring the voltage and directing operation of the variable voltage controller to achieve a preset voltage in real time.

20. The plasma reactor of claim 16 further comprising a sensor coupled with one of the substrate support and a wall of the chamber for measuring an RF voltage waveform of a current flowing therethrough.

21. The plasma reactor of claim 20 further comprising a controller coupled with the sensor and the variable voltage controller for monitoring the RF voltage waveform and directing operation of the variable voltage controller to adjust the magnitude and phase of the voltage in the electrode based on the measured RF voltage waveform.

22. The plasma reactor of claim 16 wherein the variable voltage controller controls the phase and magnitude of the voltage in the electrode.

23. The plasma reactor of claim 16 wherein the variable voltage controller comprises a variable capacitor.

24. The plasma reactor of claim 16 wherein the variable voltage controller comprises an on/off relay switch.

25. The plasma reactor of claim 16 wherein the variable voltage controller comprises an LC series connection.

26. The plasma reactor of claim 16 further comprising a sensor coupled with one of the substrate support and a wall of the chamber for sensing a current flowing therethrough, and a controller coupled with the sensor and the variable voltage controller for monitoring the current and directing operation of the variable voltage controller to capacitively couple energy into the plasma processing region to achieve a preset current in real time.

27. The plasma reactor of claim 1 wherein the electrode comprises an electrode plate having a center line generally aligned with a center line of the substrate support.

28. The plasma reactor of claim 1 wherein the chamber wall defines a flat roof transmissive of inductively coupled RF power, the inductive member comprises a flat coil antenna defining a generally centrally located aperture, and the electrode is positioned on the roof within the aperture.

29. The plasma reactor of claim 1 further comprising an inductive RF member sensor for measuring the power in the inductive RF member and a controller coupled with the power source for controlling the power in the inductive RF member.

30. The plasma reactor of claim 1 wherein the electrode is disposed generally parallel to the support surface of the substrate support.

31. The plasma reactor of claim 1 wherein the inductive RF member is annular and surrounds a center portion of chamber wall of the chamber spaced inwardly from the inductive RF member, and wherein the electrode is disposed adjacent the center portion of the chamber wall.

32. The plasma reactor of claim 1 wherein the inductive RF member comprises at least one RF coil.

33. The plasma reactor of claim 32 wherein the RF coil comprises a generally flat spiral coil disposed adjacent a generally flat top of the chamber.

34. The plasma reactor of claim 32 wherein the RF coil includes a central opening and wherein the electrode is disposed in the central opening.

35. The plasma reactor of claim 32 wherein the RF coil comprises a coil stack oriented generally perpendicular to the support surface of the substrate support for supporting the substrate.

36. The plasma reactor of claim 32 including an inner RF coil comprising an inner coil stack and an outer RF coil comprising an outer coil stack, The outer coil stack being spaced outwardly from the inner coil stack, the inner and outer coil stacks being generally perpendicular to the support surface of the substrate support for supporting the substrate.

37. The plasma reactor of claim 36 wherein the electrode includes a central electrode member disposed in a region surrounded by the inner coil stack.

38. The plasma reactor of claim 37 wherein the electrode includes an intermediate electrode member disposed in a region between the inner coil stack and the outer coil stack.

39. The plasma reactor of claim 1 further comprising:
an electrode adjusting member coupled with the electrode to vary the power received from the power source by the electrode to adjust the voltage in the electrode;
a controller configured to dynamically control the gas delivery system, the inductive RF member, the power source, and the electrode adjusting member; and
a memory, coupled to the controller, comprising a computer-readable medium having a computer-readable program embodied therein for directing operation of the plasma reactor.

40. The plasma reactor of claim 39 wherein the computer-readable program includes:
a first set of instructions for controlling the gas delivery system to introduce first process gases during a first time period into the chamber;
a second set of instructions for controlling the inductive RF member for inductively coupling energy into the chamber;
a third set of instructions for controlling the power source to supply energy to the electrode for capacitively coupling energy into the chamber; and
a fourth set of instructions for controlling the electrode adjusting member to vary the voltage of the electrode to adjust a plasma in the chamber formed by the energy coupled into the chamber for processing the substrate.

41. The plasma reactor of claim 40 wherein the fourth set of computer instructions control the electrode adjusting member to provide sufficient voltage in the electrode to facilitate igniting the plasma.

42. The plasma reactor of claim 40 wherein the fourth set of computer instructions control the electrode adjusting member to vary the voltage in the electrode to stabilize the plasma during the first time period.

43. The plasma reactor of claim 42 wherein the electrode adjusting member is controlled to vary the voltage in the electrode to maintain the plasma in a stable regime where an increase in the power supplied by the power source produces an increase in a capacitive current through the plasma.

* * * * *

UNITED STATES PATENT AND TRADEMARK OFFICE
CERTIFICATE OF CORRECTION

PATENT NO.    : 6,447,636 B1
DATED         : September 10, 2002
INVENTOR(S)   : Xue-Yu Qian et al.

It is certified that error appears in the above-identified patent and that said Letters Patent is hereby corrected as shown below:

Column 18,
Line 18, says "RP", replace with -- RF --
Line 25, says "RE", replace with -- RF --

Signed and Sealed this

Twenty-fifth Day of November, 2003

JAMES E. ROGAN
*Director of the United States Patent and Trademark Office*